(12) United States Patent
Chang et al.

(10) Patent No.: US 11,133,387 B2
(45) Date of Patent: Sep. 28, 2021

(54) FINFETS HAVING DIELECTRIC PUNCH-THROUGH STOPPERS

(71) Applicant: Taiwan Semiconductor Manufacturing Company, Ltd., Hsinchu (TW)

(72) Inventors: Cheng-Hung Chang, Hsinchu (TW); Chen-Hua Yu, Hsinchu (TW); Chen-Nan Yeh, Sinfong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 16/430,151

(22) Filed: Jun. 3, 2019

(65) Prior Publication Data

US 2019/0288070 A1    Sep. 19, 2019

Related U.S. Application Data

(60) Division of application No. 15/665,184, filed on Jul. 31, 2017, now Pat. No. 10,312,327, which is a
(Continued)

(51) Int. Cl.
*H01L 21/00* (2006.01)
*H01L 29/10* (2006.01)
(Continued)

(52) U.S. Cl.
CPC .. *H01L 29/1083* (2013.01); *H01L 21/823412* (2013.01); *H01L 21/823431* (2013.01);
(Continued)

(58) Field of Classification Search
CPC ............. H01L 29/1083; H01L 27/1207; H01L 29/0653
See application file for complete search history.

(56) References Cited

U.S. PATENT DOCUMENTS 5,972,758 A    10/1999  Liang
6,355,532 B1    3/2002  Seliskar et al.
(Continued)

FOREIGN PATENT DOCUMENTS

CN    1681103 A    10/2005
CN    1921116 A    2/2007
(Continued)

OTHER PUBLICATIONS

Balakumar, S. et al., ?Fabrication of high Ge content SiGe layer on Si by Ge condensation technique,? Proceeding of the 13th IPFA 2006, Singapore, IEEE, pp. 301-305.
(Continued)

*Primary Examiner* — Laura M Menz
(74) *Attorney, Agent, or Firm* — Slater Matsil, LLP

(57) ABSTRACT

A semiconductor structure includes a semiconductor substrate; a planar transistor on a first portion of the semiconductor substrate, wherein the first portion of the semiconductor substrate has a first top surface; and a multiple-gate transistor on a second portion of the semiconductor substrate. The second portion of the semiconductor substrate is recessed from the first top surface to form a fin of the multiple-gate transistor. The fin is electrically isolated from the semiconductor substrate by an insulator.

20 Claims, 23 Drawing Sheets

Related U.S. Application Data division of application No. 14/988,427, filed on Jan. 5, 2016, now Pat. No. 9,722,025, which is a continuation of application No. 13/314,942, filed on Dec. 8, 2011, now Pat. No. 9,230,959, which is a division of application No. 12/116,074, filed on May 6, 2008, now Pat. No. 8,106,459.

(51) Int. Cl.
| | | |
|---|---|---|
| *H01L 21/8234* | (2006.01) | |
| *H01L 27/12* | (2006.01) | |
| *H01L 29/78* | (2006.01) | |
| *H01L 27/088* | (2006.01) | |
| *H01L 29/06* | (2006.01) | |

(52) U.S. Cl.
CPC .... *H01L 21/823481* (2013.01); *H01L 27/088* (2013.01); *H01L 27/1203* (2013.01); *H01L 27/1207* (2013.01); *H01L 29/0653* (2013.01); *H01L 29/7843* (2013.01); *H01L 29/7851* (2013.01)

(56) References Cited

U.S. PATENT DOCUMENTS

| | | |
|---|---|---|
| 6,376,286 B1 | 4/2002 | Ju |
| 6,429,091 B1 | 8/2002 | Chen et al. |
| 6,448,115 B1 | 9/2002 | Bae |
| 6,599,789 B1 | 7/2003 | Abbott et al. |
| 6,706,571 B1 | 3/2004 | Yu et al. |
| 6,858,478 B2 | 2/2005 | Chau et al. |
| 6,909,147 B2 | 6/2005 | Aller et al. |
| 6,914,277 B1 | 7/2005 | Hill et al. |
| 6,936,522 B2 | 8/2005 | Steegen et al. |
| 6,936,875 B2 * | 8/2005 | Sugii ............... H01L 29/1054 257/288 |
| 7,078,722 B2 | 7/2006 | Anderson et al. |
| 7,180,134 B2 | 2/2007 | Yang et al. |
| 7,190,050 B2 | 3/2007 | King et al. |
| 7,208,796 B2 | 4/2007 | Chang |
| 7,221,006 B2 | 5/2007 | Orlowski et al. |
| 7,247,887 B2 | 7/2007 | King et al. |
| 7,256,078 B2 | 8/2007 | Anderson et al. |
| 7,265,008 B2 | 9/2007 | King et al. |
| 7,297,600 B2 * | 11/2007 | Oh ............... H01L 29/66553 257/E21.442 |
| 7,320,908 B2 | 1/2008 | Son et al. |
| 7,332,386 B2 | 2/2008 | Lee et al. |
| 7,352,034 B2 | 4/2008 | Booth, Jr. et al. |
| 7,396,726 B2 * | 7/2008 | Oh ............... H01L 29/42384 257/E21.442 |
| 7,479,421 B2 * | 1/2009 | Kavalieros ...... H01L 21/823431 257/E21.421 |
| 7,495,285 B2 | 2/2009 | Lee |
| 7,508,031 B2 | 3/2009 | Liu et al. |
| 7,528,465 B2 | 5/2009 | King et al. |
| 7,544,994 B2 | 6/2009 | Schepis et al. |
| 7,560,785 B2 | 7/2009 | Yu et al. |
| 7,605,449 B2 | 10/2009 | Liu et al. |
| 7,638,843 B2 | 12/2009 | Xiong et al. |
| 7,655,989 B2 | 2/2010 | Zhu et al. |
| 7,662,679 B2 | 2/2010 | Izumida et al. |
| 7,666,721 B2 | 2/2010 | Dyer et al. |
| 7,683,417 B2 | 3/2010 | Xiong et al. |
| 7,709,303 B2 | 5/2010 | Burnett et al. |
| 7,728,324 B2 | 6/2010 | Tezuka et al. |
| 7,745,871 B2 * | 6/2010 | Oh ............... H01L 29/78645 257/314 |
| 7,781,273 B2 | 8/2010 | Schepis et al. |
| 7,820,551 B2 | 10/2010 | Yagishita et al. |
| 7,843,000 B2 | 11/2010 | Yu et al. |
| 7,879,677 B2 | 2/2011 | Lee |
| 7,986,002 B2 * | 7/2011 | Iwanaga ............ H01L 29/785 257/330 |
| 8,022,478 B2 | 9/2011 | Anderson et al. |
| 8,039,843 B2 | 10/2011 | Inaba |
| 8,048,723 B2 * | 11/2011 | Chang ............ H01L 29/66795 438/135 |
| 8,106,459 B2 * | 1/2012 | Chang ............... H01L 27/088 257/353 |
| 8,193,567 B2 * | 6/2012 | Kavalieros ...... H01L 21/823807 257/288 |
| 8,263,462 B2 * | 9/2012 | Hung ............ H01L 21/823481 438/286 |
| 8,466,511 B2 | 6/2013 | Oh et al. |
| 9,048,259 B2 * | 6/2015 | Hung ............ H01L 29/66795 |
| 9,230,959 B2 * | 1/2016 | Chang ............... H01L 27/088 |
| 9,263,587 B1 * | 2/2016 | Jacob ............... H01L 29/161 |
| 9,722,025 B2 * | 8/2017 | Chang ................ H01L 27/1203 |
| 9,735,042 B2 * | 8/2017 | Hung ............ H01L 29/66795 |
| 10,312,327 B2 * | 6/2019 | Chang ............... H01L 29/1083 |
| 10,872,820 B2 * | 12/2020 | Block ................ H01L 22/14 |
| 2002/0190344 A1 | 12/2002 | Michejda et al. |
| 2004/0150029 A1 | 8/2004 | Lee |
| 2004/0256683 A1 | 12/2004 | Lee et al. |
| 2005/0077553 A1 | 4/2005 | Kim et al. |
| 2005/0153490 A1 | 7/2005 | Yoon et al. |
| 2005/0199919 A1 | 9/2005 | Liu et al. |
| 2005/0224875 A1 | 10/2005 | Anderson et al. |
| 2005/0250279 A1 * | 11/2005 | Son ............... H01L 29/66621 438/216 |
| 2005/0260806 A1 | 11/2005 | Chang et al. |
| 2005/0269629 A1 | 12/2005 | Lee et al. |
| 2005/0272190 A1 | 12/2005 | Lee et al. |
| 2005/0272192 A1 * | 12/2005 | Oh ............... H01L 29/66545 438/197 |
| 2006/0024879 A1 | 2/2006 | Fu et al. |
| 2006/0076625 A1 | 4/2006 | Lee et al. |
| 2006/0170053 A1 | 8/2006 | Yeo et al. |
| 2006/0281245 A1 | 12/2006 | Okuno et al. |
| 2006/0286724 A1 | 12/2006 | Anderson et al. |
| 2006/0292781 A1 | 12/2006 | Lee |
| 2007/0045748 A1 * | 3/2007 | Booth, Jr. ....... H01L 21/823807 257/369 |
| 2007/0075372 A1 | 4/2007 | Terashima et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145431 A1 | 6/2007 | Kim et al. |
| 2007/0161171 A1 | 7/2007 | Burnett et al. |
| 2007/0170474 A1 * | 7/2007 | Kawasaki ...... H01L 21/823412 257/288 |
| 2007/0172996 A1 | 7/2007 | Mathew et al. |
| 2007/0176235 A1 | 8/2007 | Tsujiuchi et al. |
| 2007/0221956 A1 | 9/2007 | Inaba |
| 2008/0001171 A1 | 1/2008 | Tezuka et al. |
| 2008/0006908 A1 | 1/2008 | Lin et al. |
| 2008/0029828 A1 * | 2/2008 | Oh ............... H01L 29/66795 257/401 |
| 2008/0048265 A1 | 2/2008 | Booth, Jr. et al. |
| 2008/0050866 A1 | 2/2008 | Booth, Jr. et al. |
| 2008/0050918 A1 | 2/2008 | Damlencourt |
| 2008/0061370 A1 | 3/2008 | Matsuo |
| 2008/0122013 A1 | 5/2008 | Schepis et al. |
| 2008/0128796 A1 | 6/2008 | Zhu et al. |
| 2008/0128797 A1 | 6/2008 | Dyer et al. |
| 2008/0132077 A1 | 6/2008 | Morishima |
| 2008/0157225 A1 | 7/2008 | Datta et al. |
| 2008/0171407 A1 | 7/2008 | Nakabayashi et al. |
| 2008/0191271 A1 | 8/2008 | Yagishita et al. |
| 2008/0224258 A1 | 9/2008 | Schepis et al. |
| 2008/0230852 A1 * | 9/2008 | Yu ............... H01L 29/785 257/401 |
| 2008/0237641 A1 * | 10/2008 | Oh ............... H01L 29/42392 257/194 |
| 2008/0265338 A1 | 10/2008 | Yu et al. |
| 2008/0290470 A1 | 11/2008 | King et al. |
| 2008/0296632 A1 | 12/2008 | Moroz et al. |
| 2009/0020792 A1 | 1/2009 | Rios et al. |
| 2009/0057846 A1 | 3/2009 | Doyle et al. |

(56) References Cited

U.S. PATENT DOCUMENTS

| | | |
|---|---|---|
| 2009/0072276 A1 | 3/2009 | Inaba |
| 2009/0090976 A1* | 4/2009 | Kavalieros ............ H01L 29/1037 257/369 |
| 2009/0108316 A1 | 4/2009 | Xiong et al. |
| 2009/0159972 A1 | 6/2009 | Jakschik et al. |
| 2009/0181477 A1 | 7/2009 | King et al. |
| 2009/0206446 A1 | 8/2009 | Russ et al. |
| 2009/0209074 A1 | 8/2009 | Anderson |
| 2009/0250769 A1 | 10/2009 | Yu et al. |
| 2009/0253266 A1 | 10/2009 | Yu et al. |
| 2009/0278196 A1* | 11/2009 | Chang ................. H01L 29/0653 257/328 |
| 2010/0002494 A1 | 1/2010 | Xiong et al. |
| 2010/0025740 A1 | 2/2010 | Lee |
| 2010/0035398 A1 | 2/2010 | Oh et al. |
| 2010/0041198 A1 | 2/2010 | Zhu et al. |
| 2010/0044784 A1* | 2/2010 | Oh ..................... H01L 29/78618 257/329 |
| 2010/0144121 A1* | 6/2010 | Chang ................. H01L 29/7851 438/478 |
| 2010/0163971 A1* | 7/2010 | Hung .................. H01L 29/1083 257/327 |
| 2010/0164102 A1 | 7/2010 | Rachmady et al. |
| 2010/0187656 A1 | 7/2010 | Ke et al. |
| 2010/0213548 A1 | 8/2010 | Chang et al. |
| 2011/0037129 A1 | 2/2011 | Yu et al. |
| 2011/0193141 A1 | 2/2011 | Lin et al. |
| 2012/0025313 A1* | 2/2012 | Chang ................. H01L 29/7851 257/347 |
| 2012/0083107 A1* | 4/2012 | Chang ................. H01L 27/1207 438/585 |
| 2012/0299110 A1* | 11/2012 | Hung ................. H01L 29/66795 257/368 |
| 2013/0009245 A1 | 1/2013 | Chang et al. |
| 2013/0234215 A1* | 9/2013 | Okano ................. H01L 29/785 257/255 |
| 2015/0262861 A1* | 9/2015 | Hung ............. H01L 21/823431 438/439 |
| 2016/0133703 A1* | 5/2016 | Chang ................. H01L 29/7851 257/349 |
| 2017/0330939 A1* | 11/2017 | Chang .................. H01L 27/088 |
| 2018/0123611 A1 | 5/2018 | Dutton et al. |
| 2019/0288070 A1* | 9/2019 | Chang ................. H01L 27/1203 |
| 2020/0035560 A1* | 1/2020 | Block ..................... H01L 24/80 |

FOREIGN PATENT DOCUMENTS

| | | |
|---|---|---|
| CN | 101038936 A | 9/2007 |
| CN | 101097954 A | 1/2008 |
| JP | 2008141177 A | 6/2008 |

OTHER PUBLICATIONS

Balakumar et al., Fabrication of Thick Germanium-on-Insulator (GeOI) Substrates, Journal of Electronic Materials, vol. 37, No. 7, 2008 (pp. 977-950).

Hisamoto, D. et al., "A Fully Depleted Lean-channel Transistor (DELTA) A novel vertical ultra thin SOI MOSFE* ," International Electron Devices Meeting, 1989, pp. 833-836, Hitachi Ltd., Japan.

Kanemura, T. et al., "Improvement of Drive Current in Bulk-FinFET using Full 3D Process/Device Simulations," International Conference on Simulation of Semiconductor Processes and Devices, 2006, pp. 131-134, Toshiba Corporation, Japan.

Liow, T.-Y. et al., Investigation of Silicon-Germanium Fins Fabricated Using Germanium Condensation on Vertical Compliant Structures, Applied Physics Letters, vol. 87, 2005, pp. 262104-262104-3.

Okano, K. et al., "Process Integration Technology and Device Characteristics of CMOS FinFET on Bulk Silicon Substrate with sub-10 nm Fin Width and 20 nm Gate Length," International Electron Devices Meeting, 2005, 4 pages, Toshiba Corporation, Japan.

Takagi, S. et al., Carrier-Transport-Enhanced Channel CMOS for Improved Power Consumption and Performance IEEE Transactions on Electron Devices, vol. 55, No. 1, Jan. 2008, pp. 21-39.

Tezuka, T. et al., "A Novel Fabrication Technique of Ultrathin and Relaxed SiGe Buffer Layers with High Ge Fraction for Sub-100 nm Strained Silicon-on-Insulator MOSFETs," Japanese Journal of Applied Physics, vol. 40, pp. 2866-2874, Part 1, No. 4B, Apr. 2001, The Japan Society of Applied Physics.

Wolf, S., "Silicon Processing for the VLSI Era," vol. 2: Process Integration, Mar. 1990, Lattice Press, vol. 2, p. 229.

\* cited by examiner

FINFETS HAVING DIELECTRIC PUNCH-THROUGH STOPPERS

This application is a divisional of U.S. patent application Ser. No. 15/665,184, filed Jul. 31, 2017, which is a divisional of U.S. patent application Ser. No. 14/988,427, filed Jan. 5, 2016, now U.S. Pat. No. 9,722,025, issued Aug. 1, 2017, which application claims benefit to and is a continuation of U.S. patent application Ser. No. 13/314,942, filed Dec. 8, 2011, U.S. Pat. No. 9,230,959, issued on Jan. 5, 2016, which application claims benefit to and is a divisional of U.S. patent application Ser. No. 12/116,074, filed May 6, 2008, now U.S. Pat. No. 8,106,459 issued on Jan. 31, 2012, all of which applications are hereby incorporated herein by reference.

TECHNICAL FIELD

This invention relates generally to semiconductor devices, and particularly to structures and formation methods of Fin field-effect transistors (FinFET).

BACKGROUND

With the increasing down scaling of integrated circuits and increasingly higher requirements for integrated circuits, transistors need to have higher drive currents with increasingly smaller dimensions. Fin field-effect transistors (FinFET) were thus developed. FIGS. 1 and 2 illustrate perspective views of conventional FinFETs. Fins 4 are formed as vertical silicon fins extending above substrate 2, and are used to form source and drain regions 6 and channel regions therebetween (not shown). Vertical gates 8 intersect the channel regions of fins 4. While not shown in FIGS. 1 and 2, gate dielectrics are formed to separate the channel regions from the respective vertical gates 8. The ends of fins 4 receive source and drain doping implants that make these portions of fins 4 conductive.

The structure shown in FIG. 1 is a silicon-on-insulator (SOI) FinFET structure, which is formed using an SOI substrate including semiconductor substrate 2, buried oxide layer (BOX) 10, and an overlying silicon layer. The overlying silicon layer is patterned to form fin 4, on which the FinFET device is based. SOI FinFET devices have excellent electrical performance. However, the manufacturing cost is high.

The structure shown in FIG. 2 is a bulk FinFET structure, which is formed starting from a bulk silicon substrate. The manufacturing cost of the bulk FinFETs is lower compared to SOI FinFETs. However, punch-through currents (leakage currents) may flow in a region not controlled by gate 8, as shown as the region 12 in FIG. 3, which is a cross-sectional view of the structure shown in FIG. 2. The cross-sectional view is made through a plane crossing line A-A' in FIG. 2. Conventionally, to reduce the punch-through currents, an impurity implantation is performed using a high energy to dope region 12 to a high impurity concentration, for example, about $10^{19}/cm^3$, wherein the impurity has a conductivity type opposite to that of source/drain regions 6. The implantation is performed after the formation of fin 4, but before the formation of gate 8. The entire fin 4 is thus implanted. By using this method with a high impurity concentration, although the punch-through currents are reduced, the carrier mobility is adversely reduced. Additionally, in this structure the fin height is affected by the position of the top surface of STI 10, which is varied in the multiple cleaning processes performed in subsequent manufacturing processes. The fin height variation is thus high, resulting in a device performance variation.

FIGS. 4 through 6 illustrate the formation of another conventional FinFET device. In FIG. 4, silicon substrate 16 is provided. Nitride strip 18 is formed on silicon substrate 16, and is used to recess silicon substrate 16, forming fin 20. In FIG. 5, nitride spacers 24 are formed to cover sidewalls of fin 20. An oxidation is then performed to form field oxide 26, as is shown in FIG. 6. The top portion of fin 20 is protected from the oxidation, and is electrically isolated from substrate 16 by field oxide 26. Advantageously, the FinFET formed based on fin 20 has substantially no punch-through currents, similar to the SOI FinFETs. Additionally, the fin height of fin 20 is not affected by the subsequent process, even if the top surface of field oxide 26 may be lowered in subsequent processes. However, the planar transistor formed on the same semiconductor chip does not have good isolation performance.

What are needed in the art, therefore, are formation methods and structures thereof that incorporate FinFETs to take advantage of the benefits associated with the increased drive currents while at the same time overcoming the deficiencies of the prior art.

SUMMARY OF THE INVENTION

In accordance with one aspect of the present invention, a semiconductor structure includes a semiconductor substrate; a planar transistor on a first portion of the semiconductor substrate, wherein the first portion of the semiconductor substrate has a first top surface; and a multiple-gate transistor on a second portion of the semiconductor substrate. The second portion of the semiconductor substrate is recessed from the first top surface to form a fin of the multiple-gate transistor. The fin is electrically isolated from the semiconductor substrate by an insulator.

In accordance with another aspect of the present invention, a semiconductor structure includes a semiconductor substrate comprising a bulk portion; and a semiconductor fin over the bulk portion of the semiconductor substrate. The semiconductor fin has a first width, and is formed of a same material as the semiconductor substrate. The semiconductor structure further includes an insulator separating the semiconductor fin into a top portion and a bottom portion electrically isolated from each other, wherein the bottom portion is physically connected to the semiconductor substrate.

In accordance with yet another aspect of the present invention, a semiconductor structure includes a semiconductor substrate; and an isolation region over the semiconductor substrate and having a bottom surface, wherein the isolation region includes a first portion having a first top surface and a second portion having a second top surface lower than the first top surface. The semiconductor structure further includes a first active region adjacent the first portion of the isolation region, wherein a top surface of the first active region is substantially leveled with the first top surface; a second active region adjacent the second portion of the isolation region, wherein the second active region has a top surface higher than the second top surface; an insulator separating the second active region into a top portion and a bottom portion electrically disconnected from each other; a planar transistor on the first active region; and a multiple-gate transistor having the top portion of the second active region as source/drain and channel regions.

In accordance with yet another aspect of the present invention, a method of forming a semiconductor structure includes providing a semiconductor substrate; forming an isolation region in the semiconductor substrate, wherein the isolation region encircles an active region; and recessing a top portion of the isolation region to expose sidewalls of the active region. The method further includes, at a level between a top surface of the active region and a bottom surface of the isolation region, oxidizing an intermediate portion of the active region to form an insulator layer separating the active region into a top portion and a bottom portion.

In accordance with yet another aspect of the present invention, a method of forming a semiconductor structure includes providing a semiconductor substrate; forming a plurality of isolation regions having a first height, wherein the plurality of isolation regions defines an active region; recessing the plurality of isolation regions to expose sidewalls of the active region; forming a hard mask to cap the active region, wherein portions of the plurality of isolation regions are exposed through the hard mask; recessing the exposing portions of the plurality of isolation regions to expose sidewalls of the active region; and oxidizing the exposed sidewalls of the active region to form an insulator layer fully isolating an upper portion of the active region from the semiconductor substrate.

In accordance with yet another aspect of the present invention, a method of forming a semiconductor structure includes providing a semiconductor substrate including a planar device region and a FinFET region; forming a plurality of isolation regions, wherein the plurality of isolation regions defines a first active region in the planar device region and a second active region in the FinFET region; performing a first recessing on the plurality of isolation regions to expose sidewalls of the second active region, wherein sidewalls of the first active region remain unexposed; forming a hard mask to mask exposed portions of the sidewalls of the second active region; performing a second recessing on the exposing portions of the plurality of isolation regions to expose portions of the sidewalls of the second active region below the hard mask; and oxidizing the exposed sidewalls of the second active region to form an insulator layer. The insulator layer isolates a top portion of the second active region from the semiconductor substrate.

The advantageous features of the present invention include reduced punch-through currents in FinFETs, improved carrier mobility in the channels of the FinFETs, and a low production cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

An integrated circuit formation process including the formation of a planar transistor and a fin field-effect transistor (FinFET, also referred to as a multi-gate transistor or a tri-gate transistor) are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
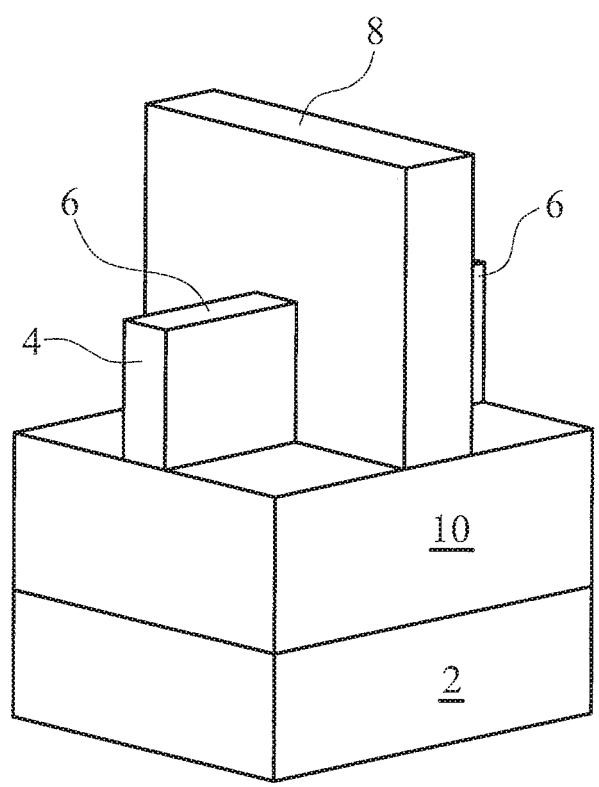
FIG. 1 illustrates a conventional fin field-effect transistor (FinFET) formed on a silicon-on-insulator substrate.
Figure 2:
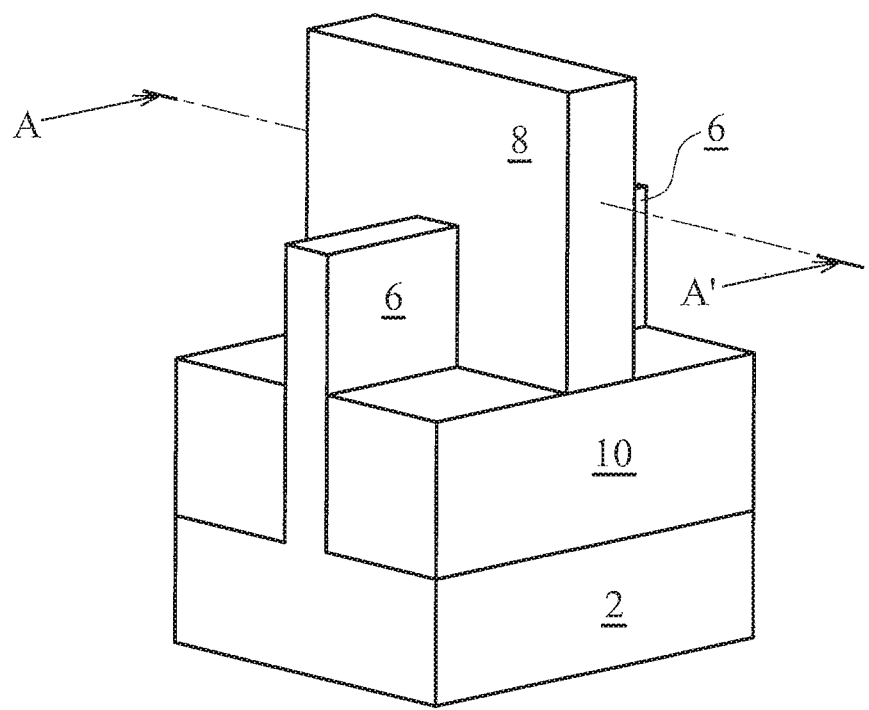
FIG. 2 illustrates a conventional FinFET formed on a bulk substrate.
Figure 3:
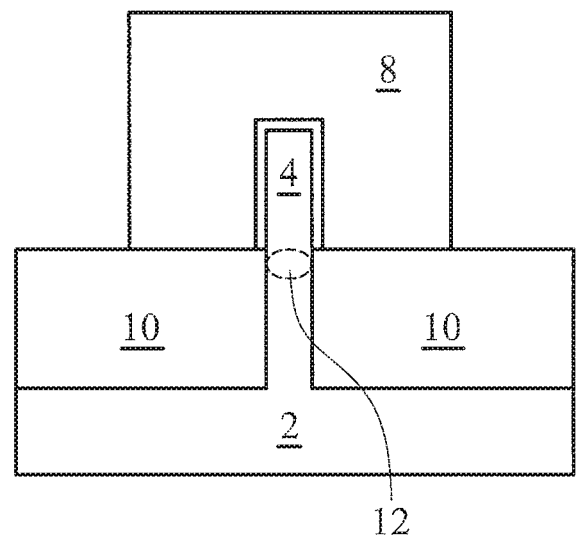
FIG. 3 illustrates a cross-sectional view of the FinFET shown in FIG. 2.
Figure 4:
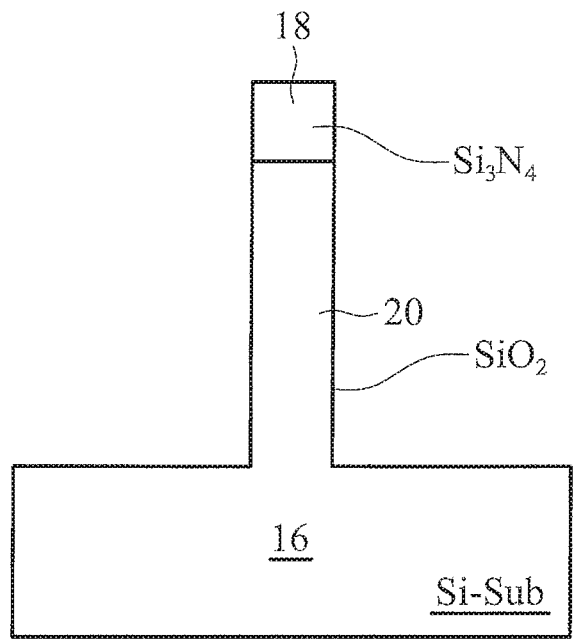
FIGS. 4 through 6 are cross-sectional views of intermediate stages in the formation of a conventional FinFET.
Figure 5:
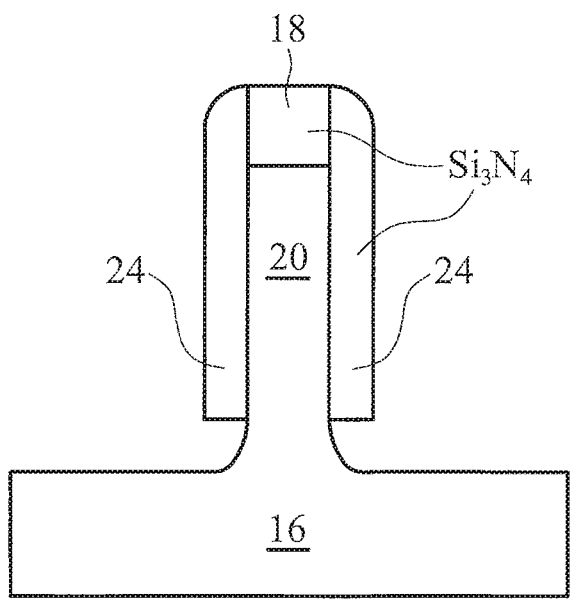
Figure 6:
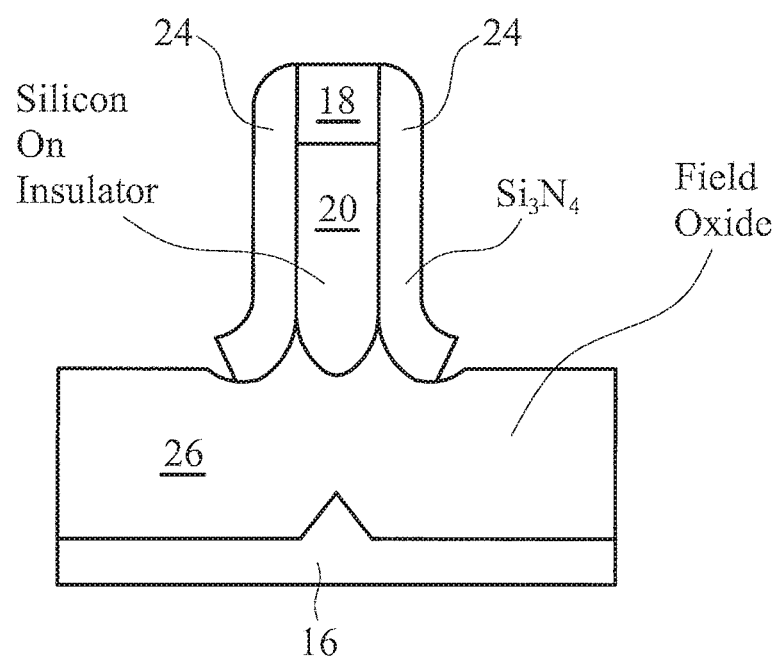
Figure 7:
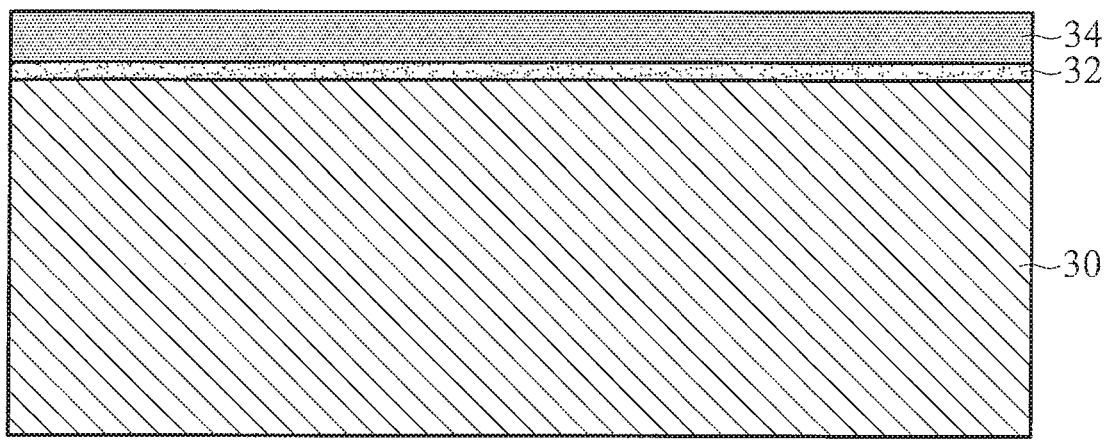
FIGS. 7 through 21 are cross-sectional views of intermediate stages in the manufacturing of a first embodiment of the present invention, which includes a planar transistor and a FinFET.

Referring to FIG. 7, semiconductor substrate 30 is provided. In the preferred embodiment, semiconductor substrate 30 is a bulk silicon substrate. Other commonly used materials, such as carbon, germanium, gallium, arsenic, nitrogen, indium, phosphorus, and the like, may also be included in semiconductor substrate 30. Semiconductor substrate 30 may be in the form of a single crystal or compound materials, and may include an epitaxy layer.

Pad layer 32 and mask layer 34 are formed on semiconductor substrate 30. Pad layer 32 is preferably a thin film formed through a thermal process, and thus including silicon oxide. It is used to buffer semiconductor substrate 30 and mask layer 34 so that less stress is generated. Pad layer 32 may also act as an etch stop layer for etching the subsequently formed mask layer 34. In the preferred embodiment, mask layer 34 is formed of silicon nitride using low-pressure chemical vapor deposition (LPCVD). In other embodiments, mask layer 34 is formed by thermal nitridation of silicon, plasma enhanced chemical vapor deposition (PECVD), or plasma anodic nitridation using nitrogen-hydrogen. Mask layer 34 may have a thickness of about 60 nm to about 120 nm. It is noted, however, that the dimensions recited throughout the description are merely examples, and may change if the integrated circuits are formed using different technologies.

Figure 8:
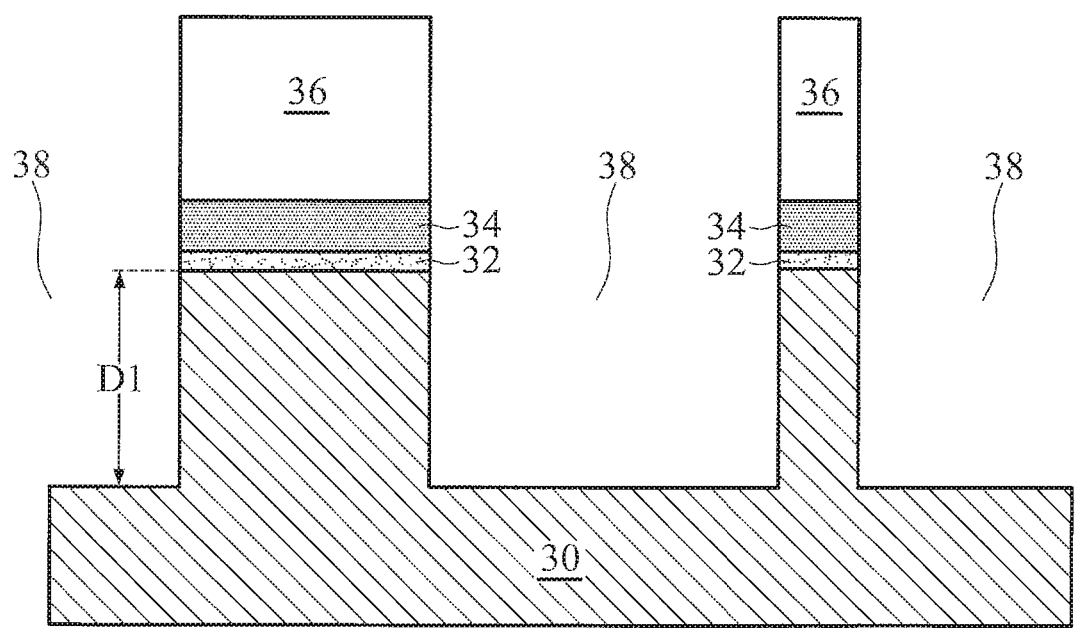

Referring to FIG. 8, photoresist 36 is formed on mask layer 34, and is then patterned, forming openings 38 in photoresist 36. Mask layer 34 and pad layer 32 are then etched through openings 38, exposing underlying semiconductor substrate 30. Next, semiconductor substrate 30 is etched, so that openings 38 extend into semiconductor substrate 30. In an exemplary embodiment, the recessing depth D1 of semiconductor substrate 30 is between about 100 nm and about 300 nm.

Figure 9:
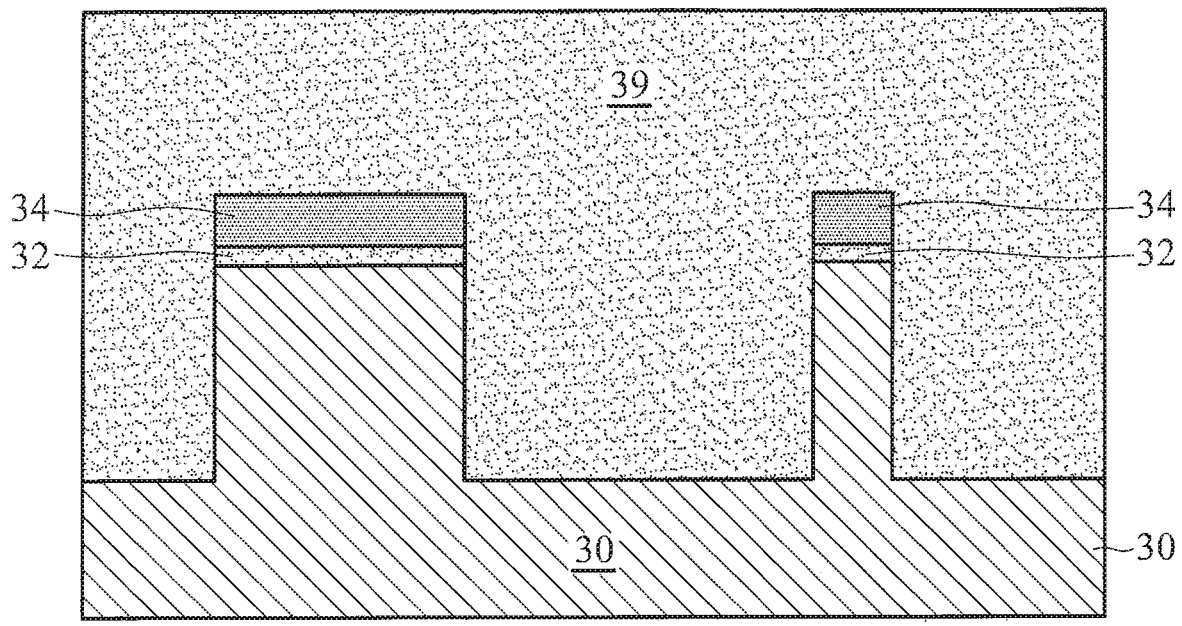
Figure 10:
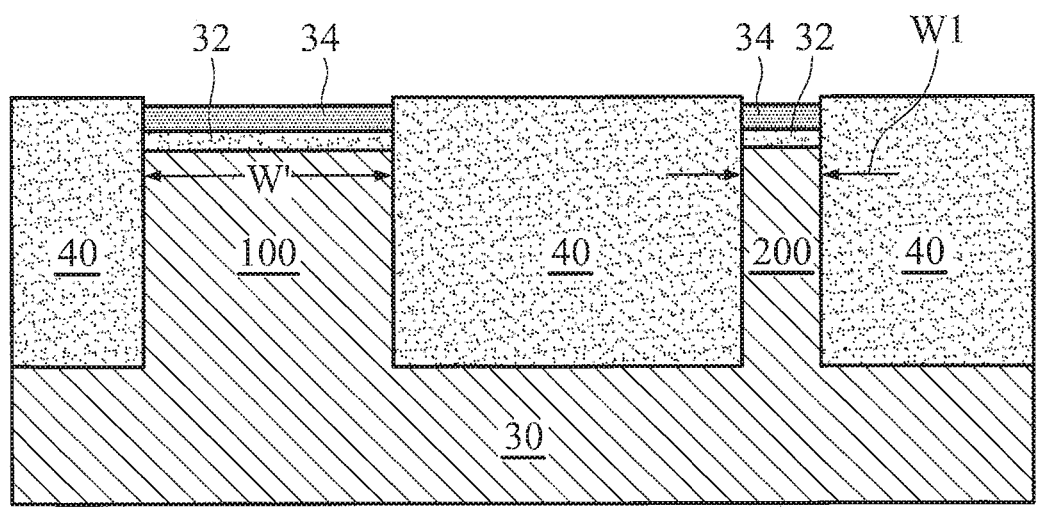

In the preferred embodiment, as shown in FIG. 9, openings 38 are filled with dielectric material 39, preferably silicon oxide formed by sub-atmospheric chemical vapor deposition (SA-CVD). In other embodiments, mask layer 39 is formed by high-density plasma chemical vapor deposition (HDP-CVD) or spin on glass (SOG). A chemical mechanical polish (CMP) is then performed to planarize the surface of the wafer, forming shallow trench isolation (STI) regions 40, and the resulting structure is shown in FIG. 10. Mask layer 34 is used as a CMP stop layer. The STI regions 40 separate active region 100, which is used for forming a planar transistor, and active region 200, which is used for forming a FinFET. In an exemplary embodiment, a ratio of the width W' of active region 100 to width W1 of active region 200 is greater than about 1.

Figure 11:
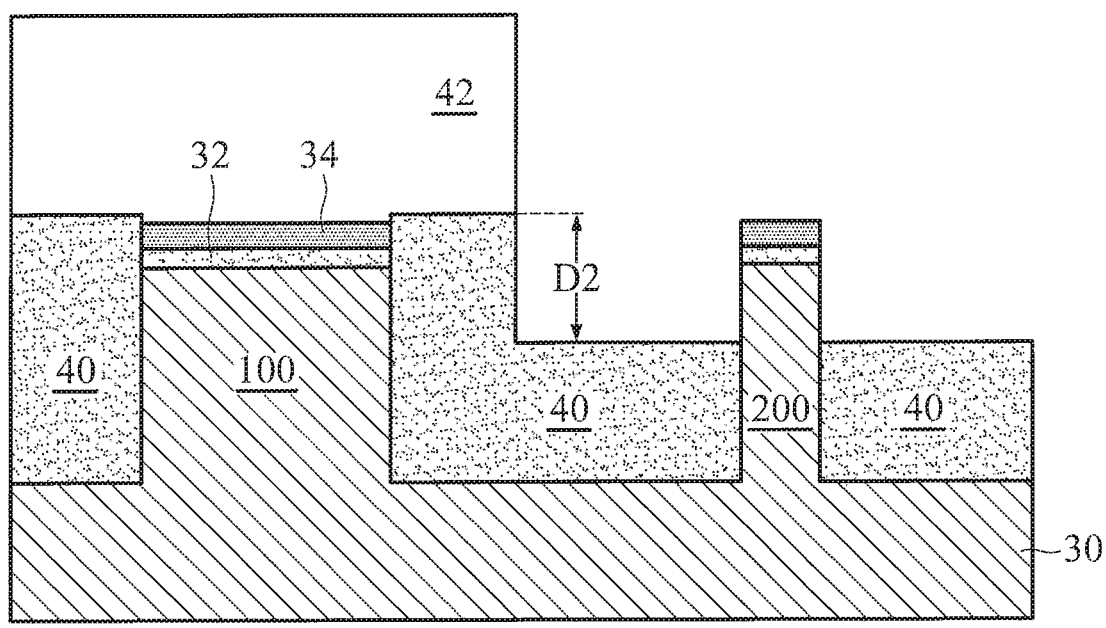

Referring to FIG. 11, photoresist 42 is formed to cover active region 100 and some surrounding STI regions 40, while active region 200 and some surrounding STI regions 40 are exposed. The exposed STI regions 40 are then recessed. As a result, active region 200 has a portion extending over the surrounding STI regions 40, and thus is alternatively referred to as fin 200. In an exemplary embodiment, the recessing distance D2 is between about 30 nm and about 90 nm. Photoresist 42 is then removed, followed by an annealing in a hydrogen environment. In an embodiment, the hydrogen annealing is performed at between about 850° C. and about 1050° C. The hydrogen annealing causes the migration of silicon atoms, and hence the exposed sidewalls of fin 200 are smoothened.

Figure 12:
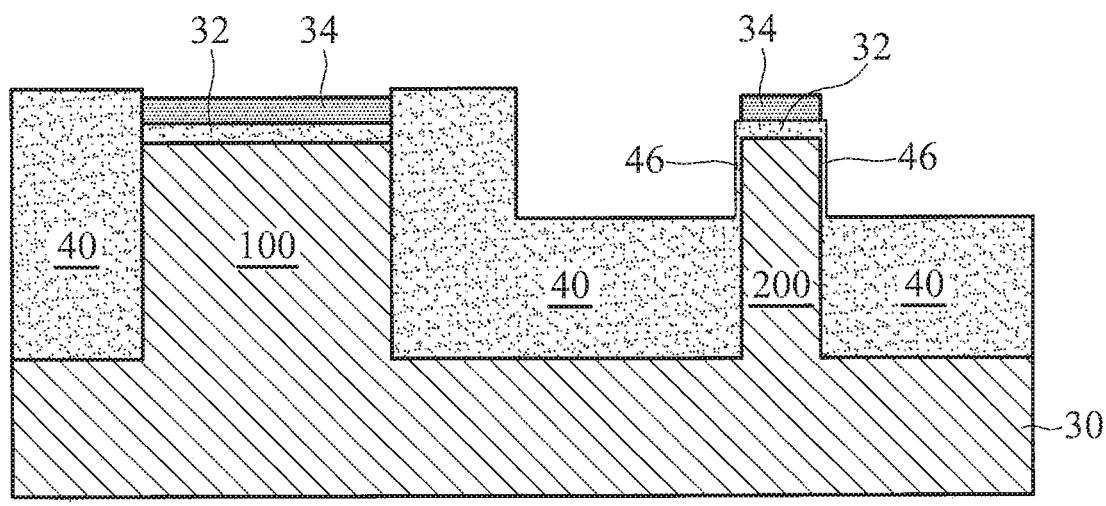
Figure 13:
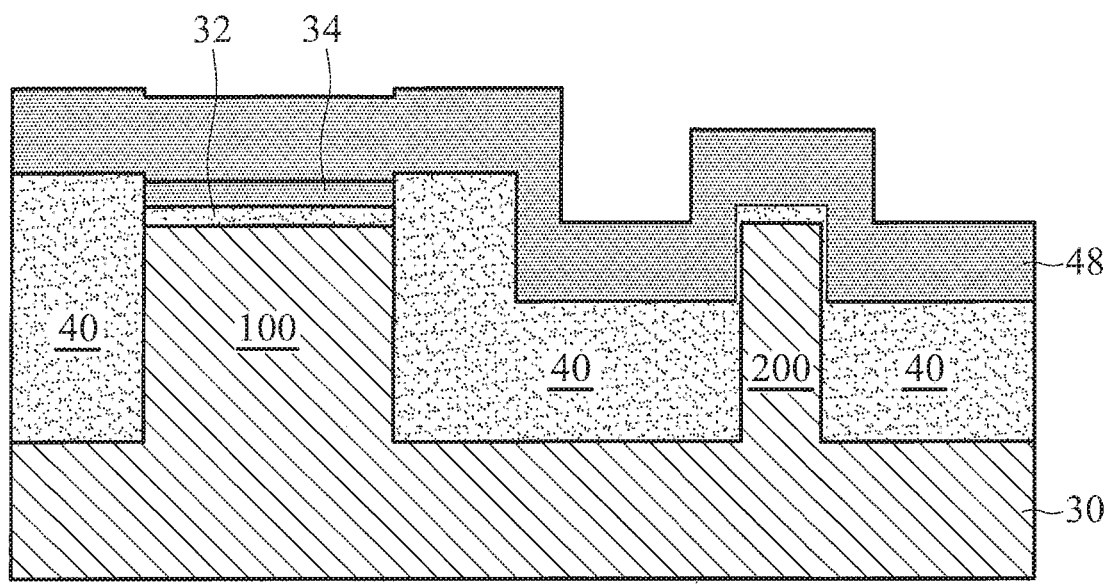

In FIG. 12, an oxidation is performed, and buffer oxide 46 is formed on sidewalls of fin 200. Buffer oxide 46 may have a thickness of between about 2 nm and about 6 nm, and may be formed at temperatures between about 650° C. and about 1050° C. Next, as is shown in FIG. 13, hard mask 48 is formed, which may also be formed of silicon nitride. In an exemplary embodiment, hard mask 48 has a thickness of between about 10 nm and about 50 nm. The exemplary formation methods include LPCVD, PECVD, and the like. The formation temperature may be between about 400° C. and about 900° C.

Figure 14:
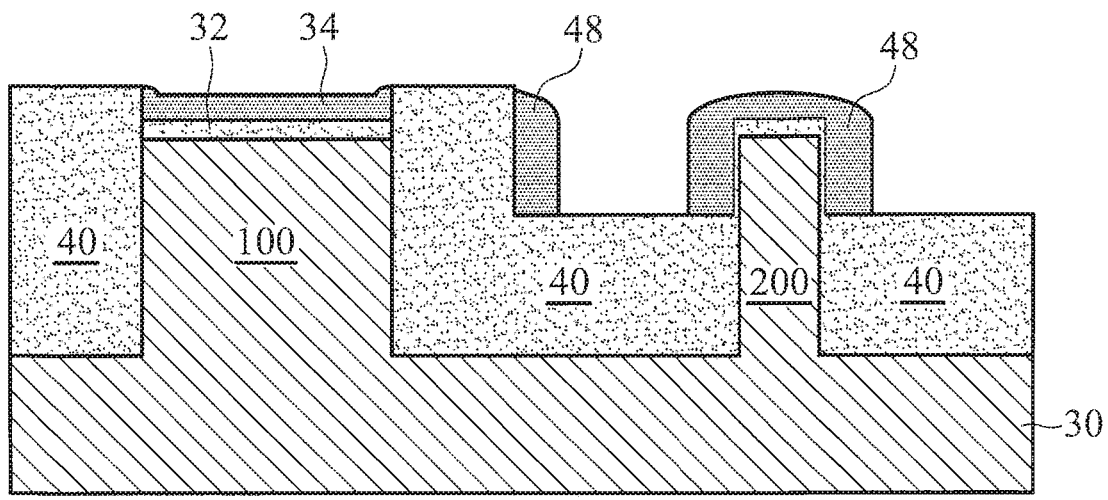
Figure 15:
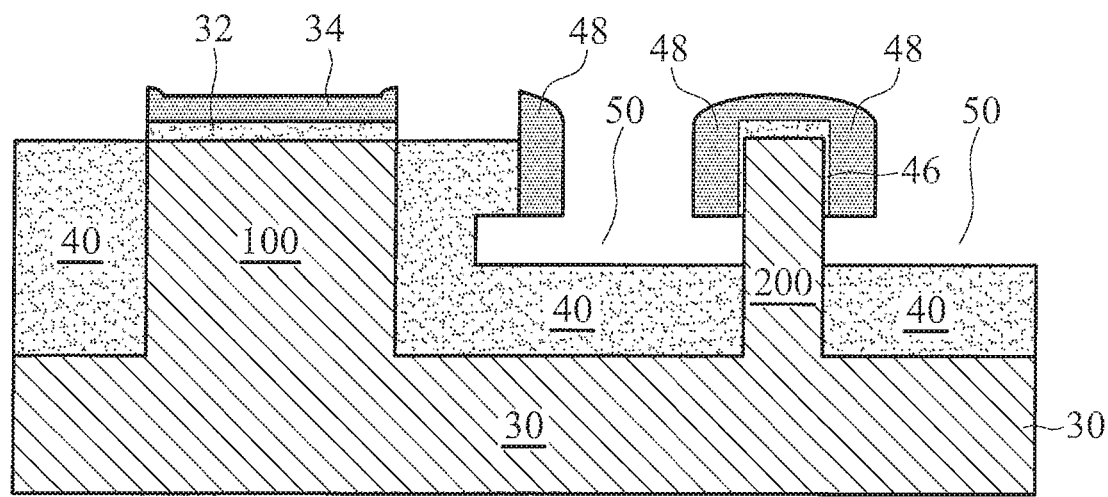

Next, as shown in FIG. 14, a dry etch is performed to remove horizontal portions of hard mask 48. At least some vertical portions of hard mask 48 remain un-etched. STI regions 40 are exposed through the remaining portions of hard mask 48. Referring to FIG. 15, a wet etch (or other isotropic etch) is performed. In an exemplary embodiment, the wet etch is performed using a mixed solution of HF and $NH_4F$, which has about 20:1 $SiO_2$/SiN selectivity. Accordingly, the remaining portions of hard mask 48 are substantially un-etched. Since the wet etch is isotropic, the recesses 50 extend under the remaining portion of hard mask 48, and the sidewalls of fin 200 are exposed.

Figure 16:
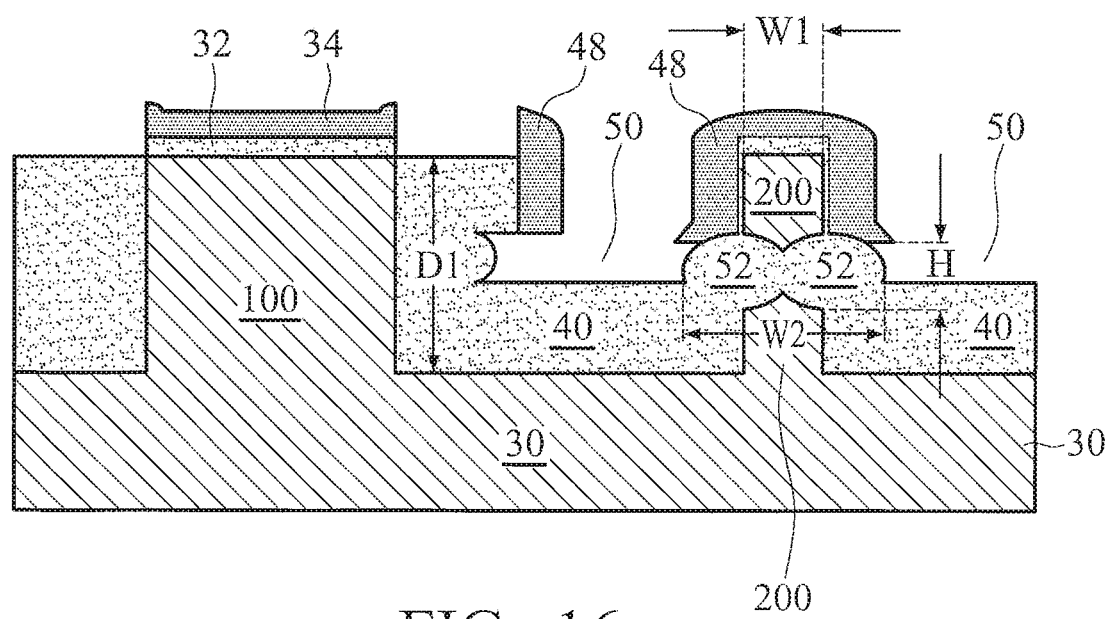

In FIG. 16, a further oxidation is performed, and the exposed portion of fin 200 is oxidized, forming oxide regions 52. Preferably, the oxide regions 52 formed on opposing sides of fin 200 join each other, so that the upper portion of fin 200 is fully isolated from substrate 30. Alternatively, oxide regions 52 substantially fully, although not completely, isolate the upper portion of fin 200 from substrate 30. Due to the volume increase in the oxidation, the width W2 of the resulting oxide regions 52 may be between about two times to three times the width W1 of fin 200. It is realized the width W2 depends on the amount of oxygen in oxide regions 52, and the process conditions. An exemplary ratio of the height D1 of STI regions 40 to the height H of punch-through stoppers 52 is between about 1.4 and 30. The oxide regions 52 are also referred to as punch-through stoppers due to their function in stopping the punch-through currents. It is likely the bottom portion of fin 200 as shown in FIG. 16 is under oxide regions 52, and remains un-oxidized. Advantageously, even if the top surface of STI regions 40 surrounding fin 200 is lowered in subsequent cleaning processes, the fin height (which is independent from the level of the top surface of STI regions 40) is fixed, resulting in more stable performance of the resulting FinFET. In an exemplary embodiment, the height of fin 200 is about 30 nm to about 90 nm.

Figure 17:
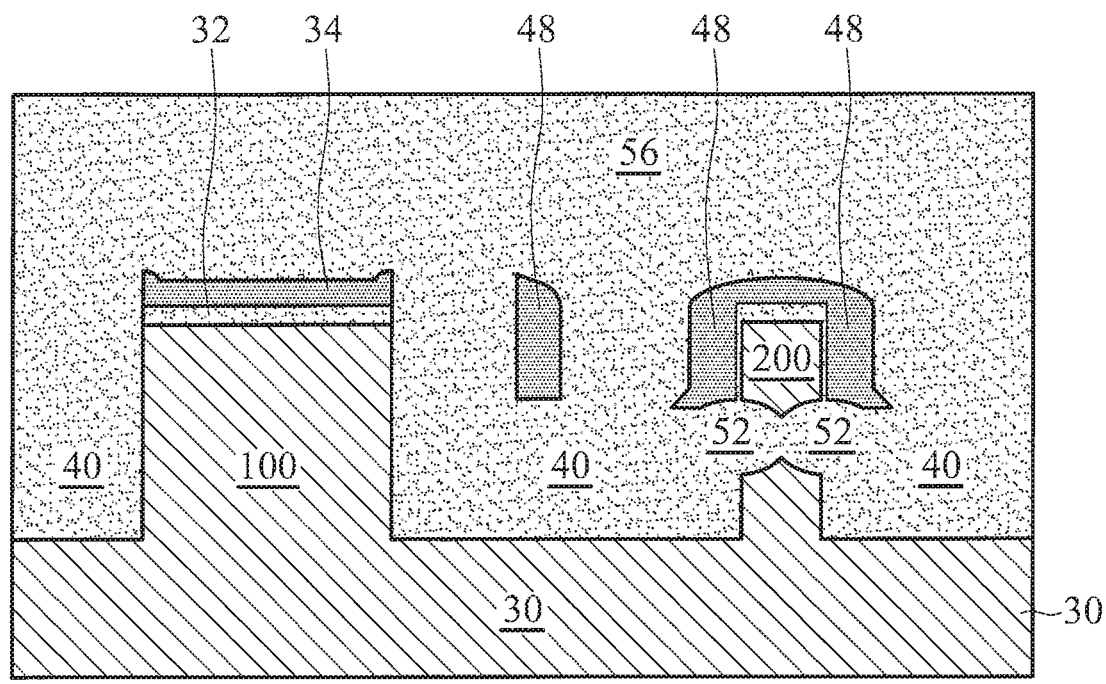
Figure 18:
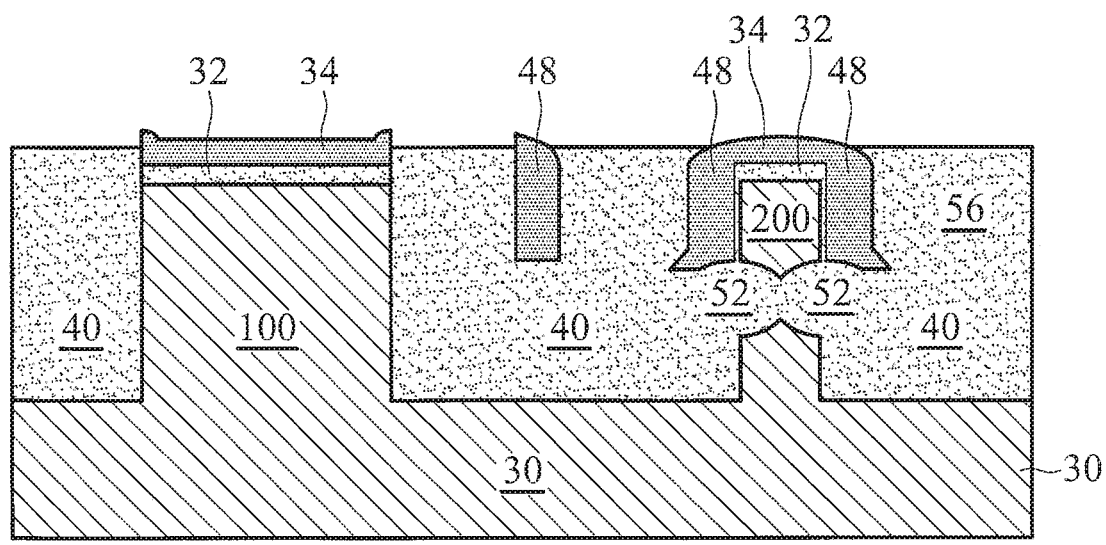

Referring to FIG. 17, oxide 56 is filled into recesses 50, until the top surface of oxide 56 is higher than the top surface of hard mask 34. In the preferred embodiment, spin-on-glass (SOG) oxide is used for its good gap-filling ability, although oxide 56 may also be formed using other methods with a good gap-filling ability, such as sub-atmospheric chemical vapor deposition (SACVD), and even HDPCVD. A CMP is then performed to remove excess oxide 56, until hard mask 34 is exposed, wherein hard mask 34 is used as a CMP stop layer. The resulting structure is shown in FIG. 18.

Figure 19:
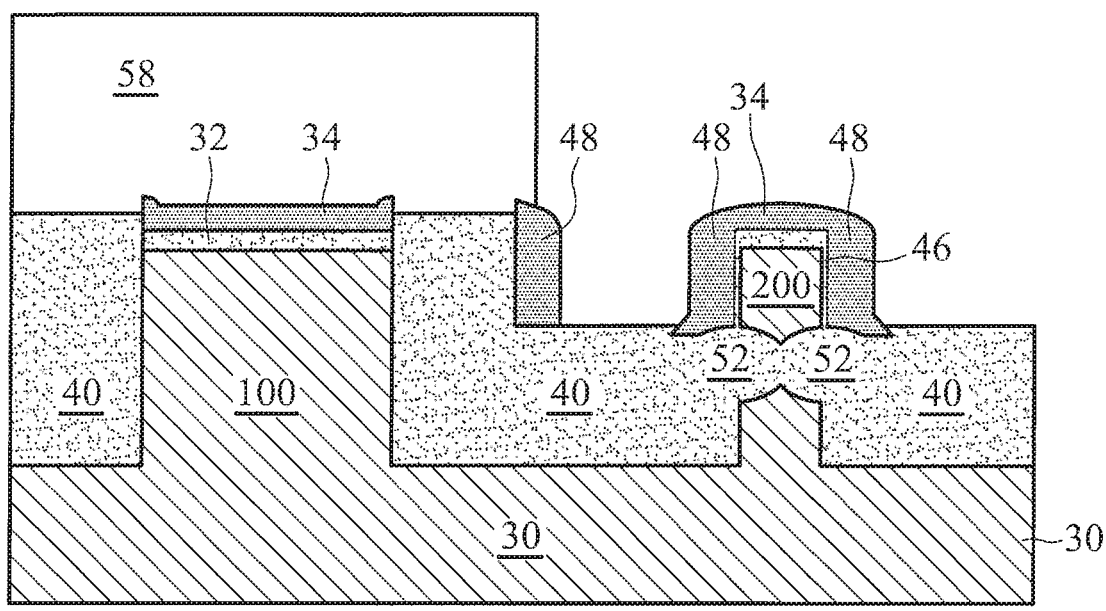
Figure 20:
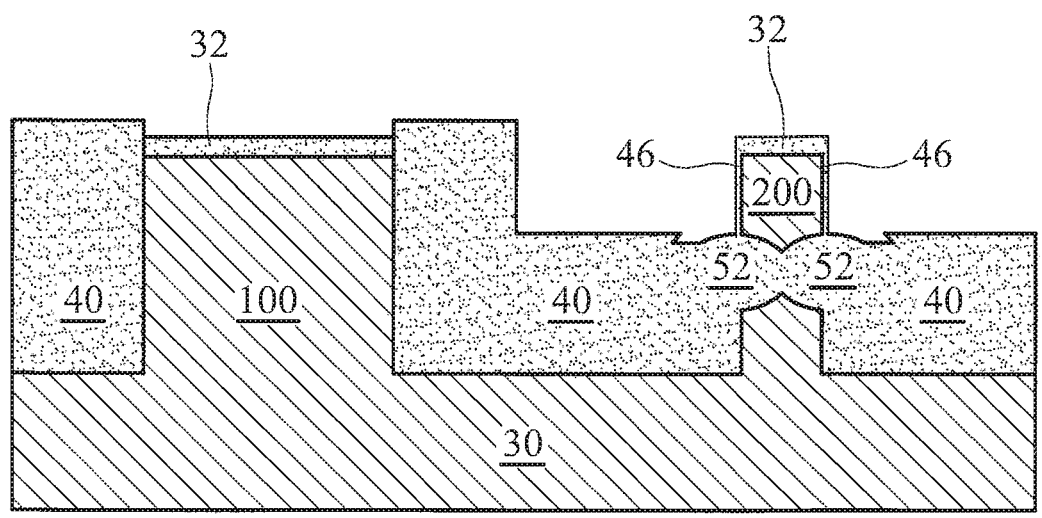
Figure 21:
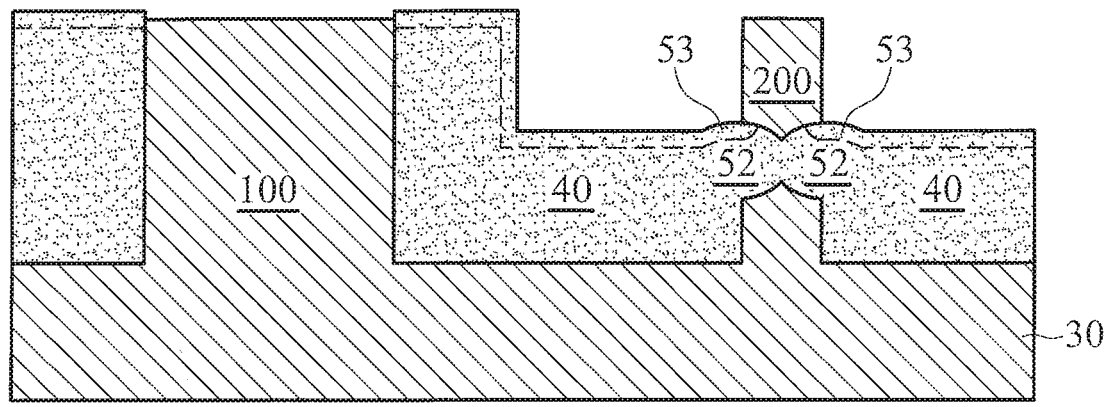

In FIG. 19, photoresist 58 is formed over active region. An etching is performed to recess oxide 56 surrounding fin 200. Preferably, the etching stops at a position leveled with the bottom of fin 200, or any position over the bottom of fin 200 by less than about 20 nm. In FIGS. 20 and 21, the remaining hard masks 34 and 48 are removed. Followed by the removal of buffer oxide 46. The resulting structure is shown in FIG. 21, which illustrates active region 100, on which a planar transistor may be formed, and fin 200 for forming a FinFET. Advantageously, fin 200 is fully electrically isolated from substrate 30.

Figure 22:
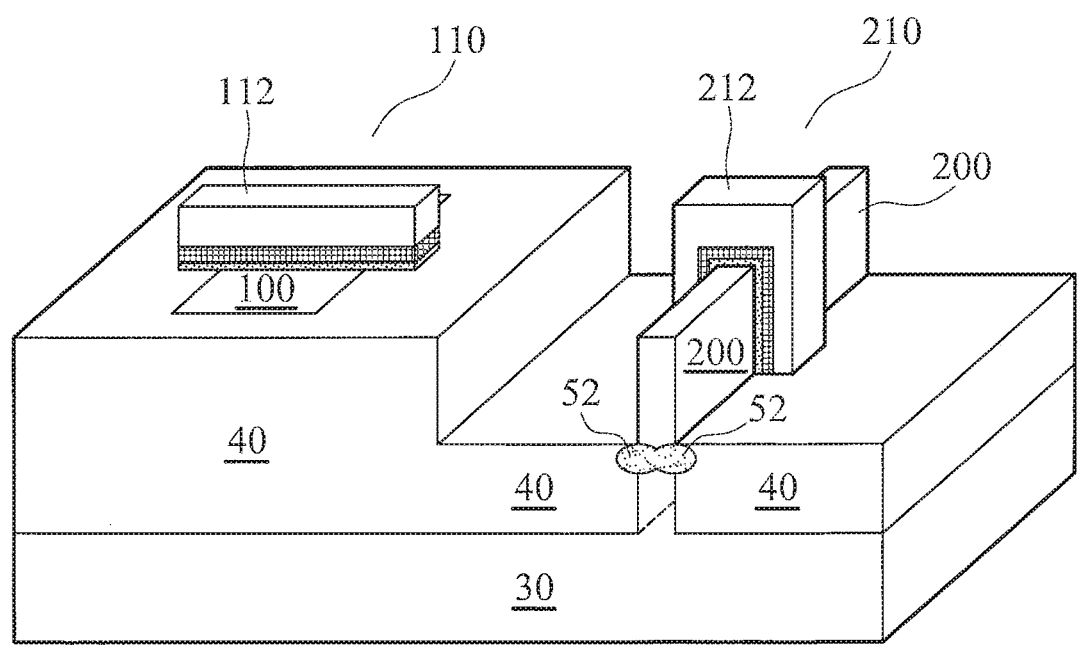
FIG. 22 illustrates a perspective view of the planar transistor and the FinFET manufactured using the steps shown in FIGS. 7 through 21.

Next, gate stacks for the planar transistor and the FinFET may be formed, as is shown in FIG. 22, which is a perspective view. As is known in the art, the gate stacks may be formed using gate-first approaches or gate-last approaches, the resulting planar transistor 110 and FinFET 210 are shown in FIG. 22. The processes for forming gate stacks are briefly discussed as follows. It is noted that in the subsequent steps, a top portion, for example, portion 53 (refer to FIG. 21) as illustrated with dotted lines, of punch-through stoppers 52 may be removed by the acids used in the cleaning steps. As a result, the resulting gate of the FinFET may include a portion under edge portions of fin 200, resulting in an Omega transistor.

In the gate-first approach, after the structure as shown in FIG. 21 is formed, a well implantation is performed to dope active region 100 and fin 200, wherein the doped impurity has a conductivity type opposite to that of the source/drain doping. A gate dielectric layer and a gate electrode layer (not shown) are then formed, wherein the gate dielectric layer may be formed of high-k dielectric materials, and the gate electrode layer may be formed of metals, metal silicides, polysilicon, metal nitrides, and the like. The gate dielectric layer and the gate electrode layer are then patterned to form gate stack 112 and gate stack 212. Next, lightly doped source/drain (LDD) regions are formed, followed by the formation of gate spacers (not shown). Source/drain regions are then formed by an implantation to exposed active regions 100 and 200 and an activation annealing. Silicides (not shown) are then formed, followed by the formation of a contact etch stop layer, an inter-layer dielectric, and contact plugs (also not shown). The process details are well known in the art, and hence are not repeated herein.

In a gate-last approach, after the structure as shown in FIG. 21 is formed, a well implantation is performed to dope active region 100 and fin 200, wherein the doped impurity has a conductivity type opposite to that of the source/drain doping. Dummy gates, preferably formed of polysilicon, are then formed. Next, LDD regions are formed, followed by the formation of gate spacers (not shown). Source/drain regions are then formed by an implantation to exposed active regions 100 and 200 and an activation annealing. Source/drain silicides (not shown) are then formed, followed by the formation of contact etch stop layer, and inter-layer dielectric. After the inter-layer dielectric is polished to expose the dummy gates, the dummy gates are etched, and replaced by metal-containing gates having appropriate work functions. Contact plugs are then formed.

Figure 23:
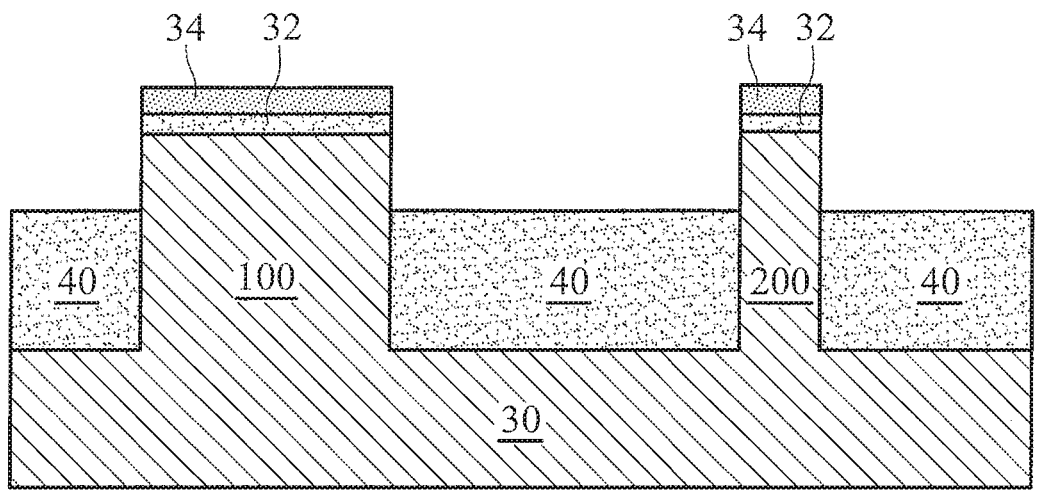
FIGS. 23 through 33 are cross-sectional views of intermediate stages in the manufacturing of a second embodiment of the present invention, which again includes a planar transistor and a FinFET.
Figure 24:
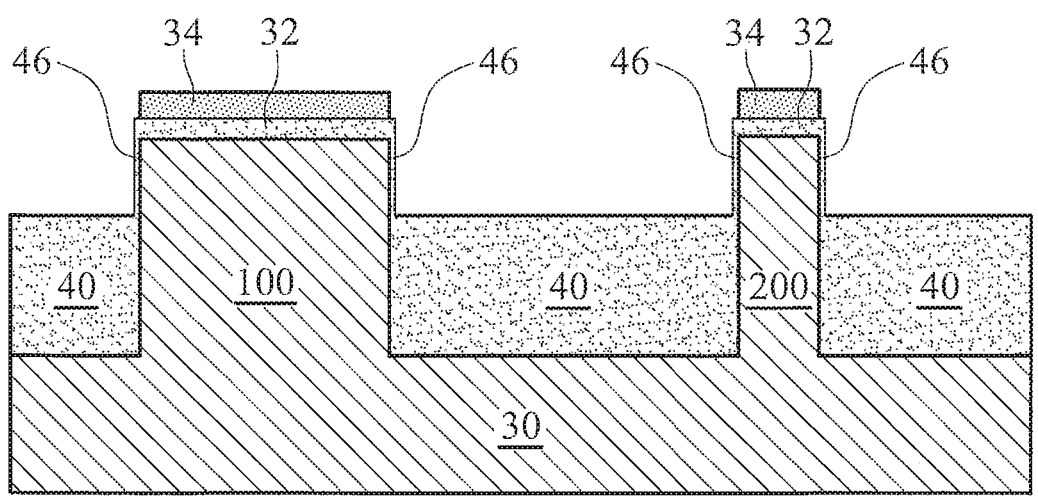
Figure 25:
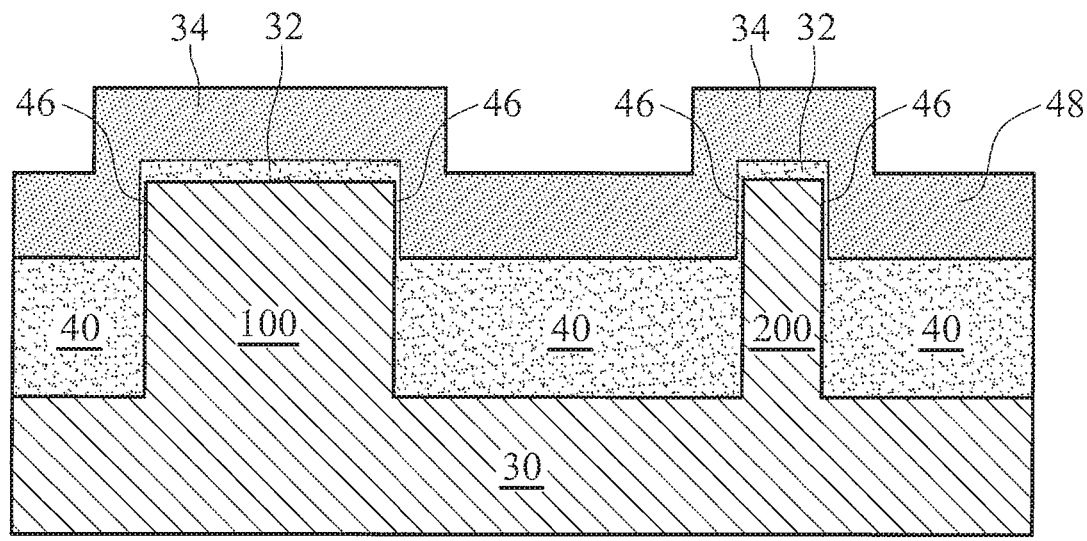
Figure 26:
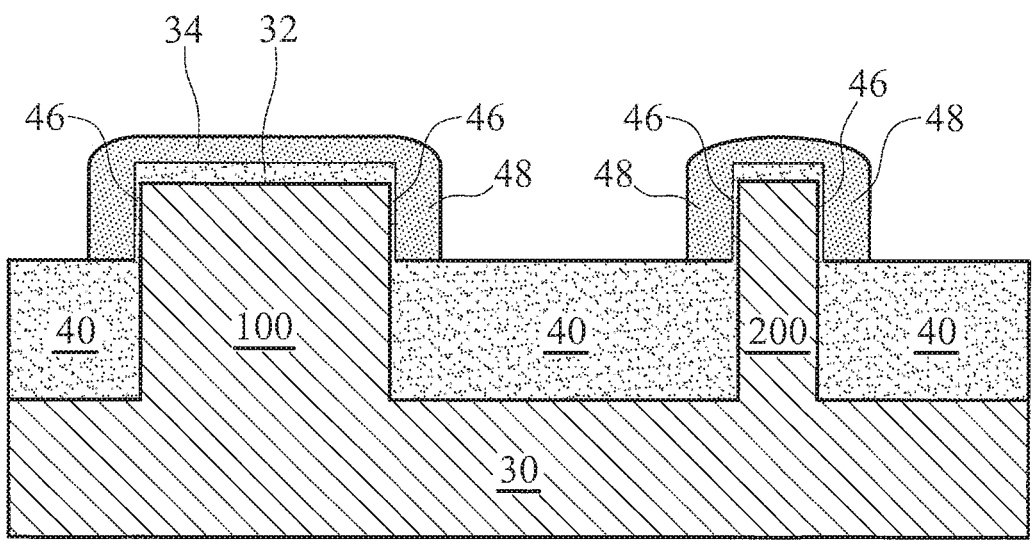

FIGS. 23 through 33 illustrate cross-sectional views of intermediate stages in the manufacturing of another embodiment of the present invention. Unless specified otherwise, the materials and formation methods of the components in this embodiment are essentially the same as the like components in the embodiment shown in FIGS. 7 through 21. The initial steps of this embodiment are essentially the same as shown in FIGS. 7 through 10. In FIG. 23, STI regions 40 are recessed, wherein the recess depth is essentially the same as shown in FIG. 11. The recess is performed without using photo resists or other masks. Alternatively, a photoresist (not shown) is formed to cover all other regions except the regions for forming planar transistors and FinFETs. Accordingly, the sidewalls of active regions 100 and 200 are exposed. In FIG. 24, buffer oxides 46 are formed, preferably with a thermal oxidation. Next, as shown in FIGS. 25 and 26, hard mask 48 is formed, followed by a dry etching to remove its horizontal portions. As a result, the remaining portions of hard mask 48 covers sidewalls of both active regions 100 and 200 (with buffer oxides 46 between hard mask 48 and active regions 100 and 200).

Figure 27:
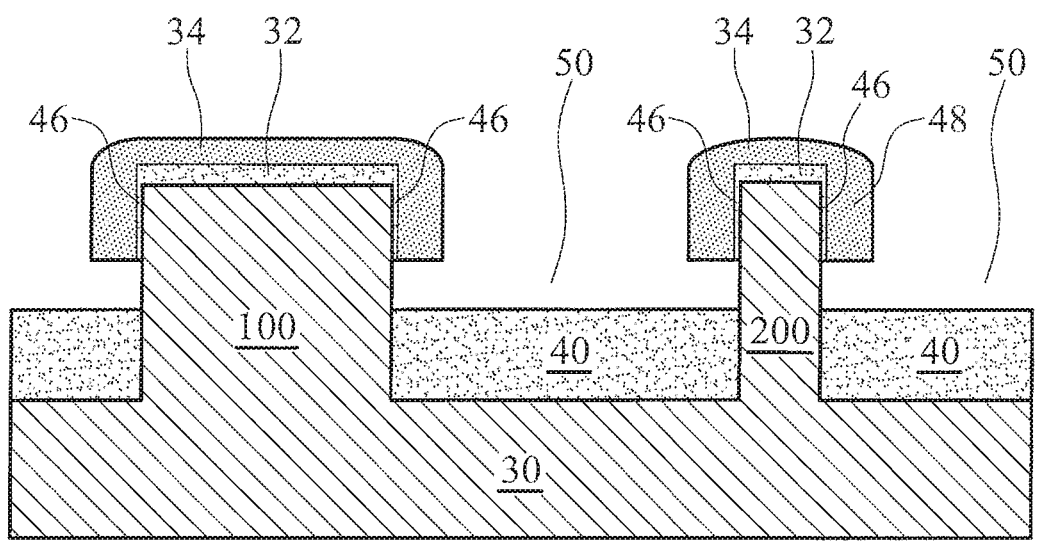
Figure 28:
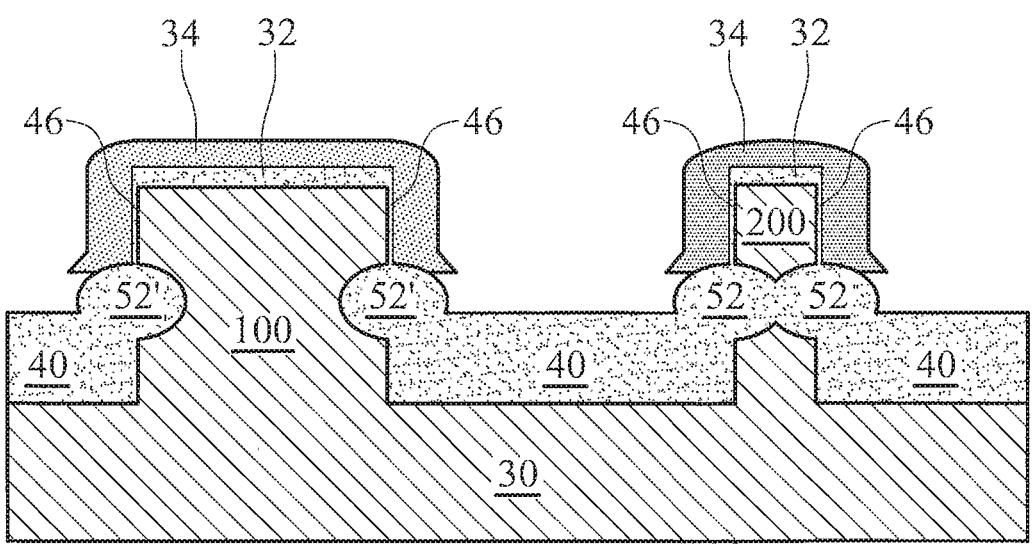

Next, as shown in FIG. 27, an isotropic etching, preferably wet etching, is performed to remove top portions of STI regions 40, exposing sidewalls of active regions 100 and 200. In FIG. 28, an oxidation is performed to form punch-through stoppers 52 and under-cut oxidation regions 52'. Again, punch-through stoppers 52 preferably fully electrically isolates substrate 30 from fin 200. On the other hand, since active region 100 is wider than fin 200, the resulting under-cut oxidation regions 52' on the opposing sides of active region 100 do not join each other.

Figure 29:
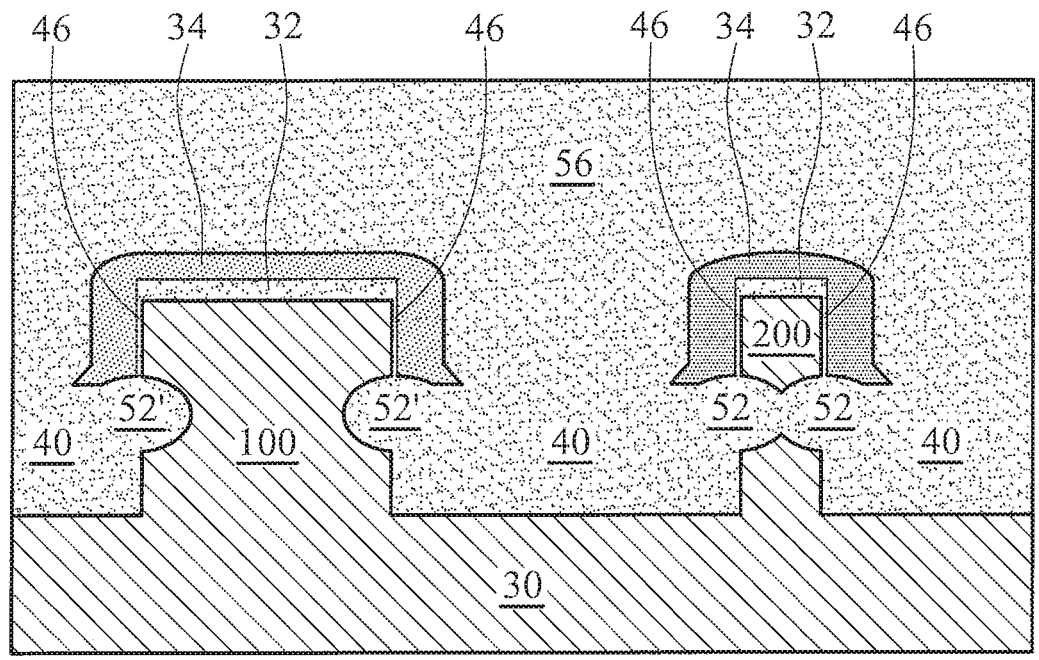
Figure 30:
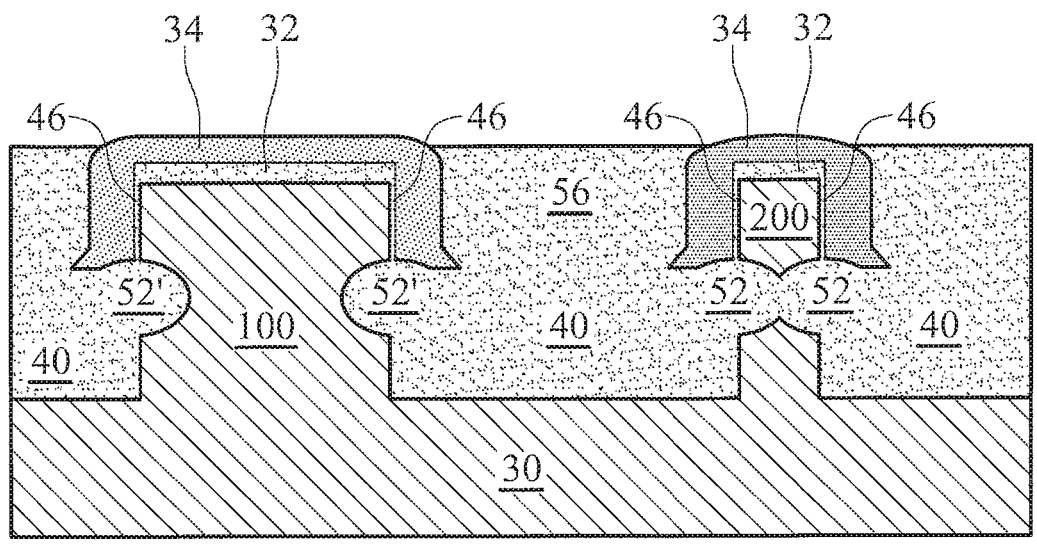
Figure 31:
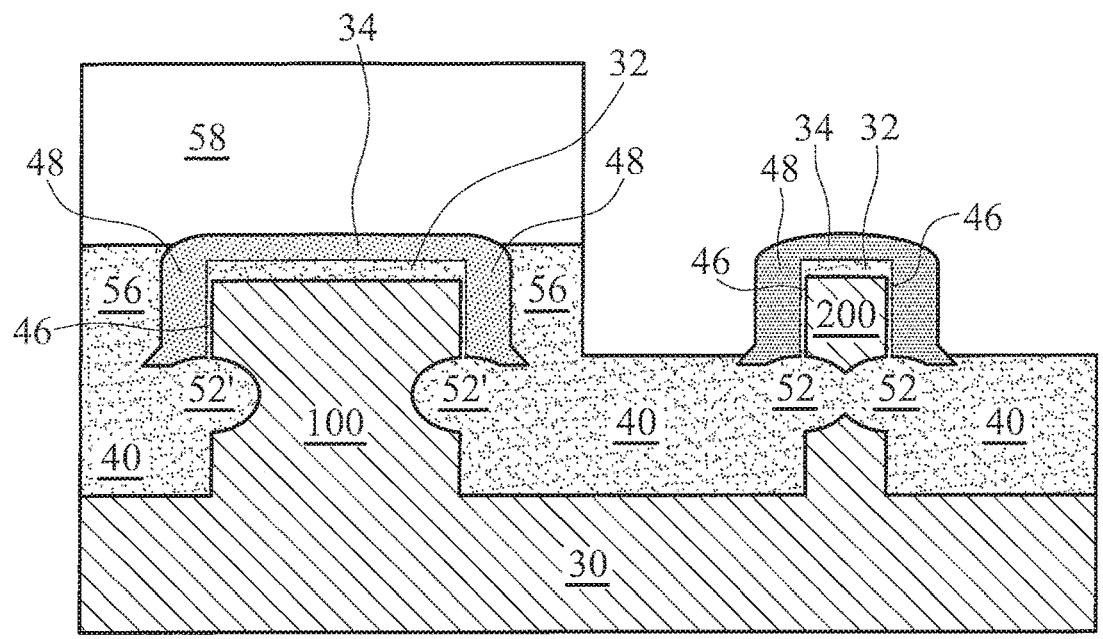
Figure 32:
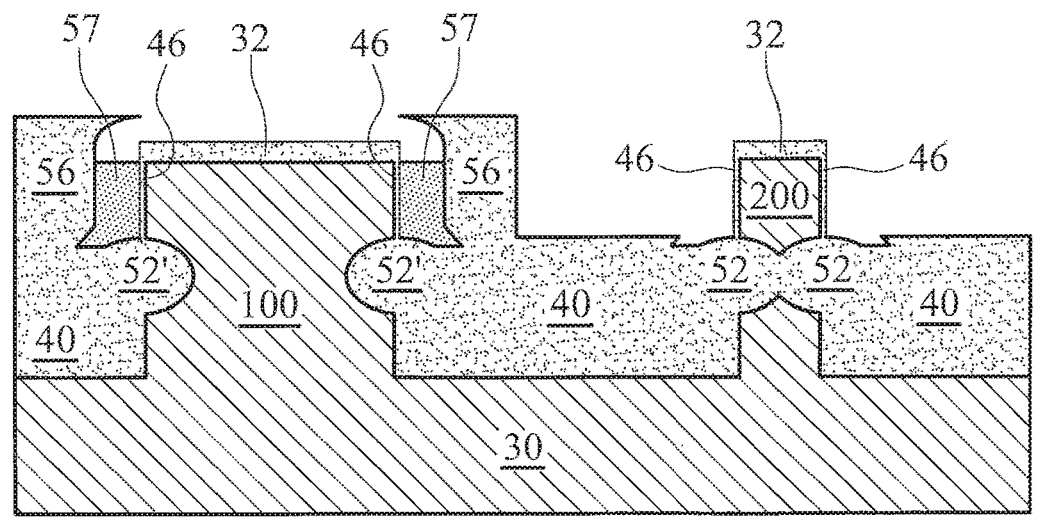
Figure 33:
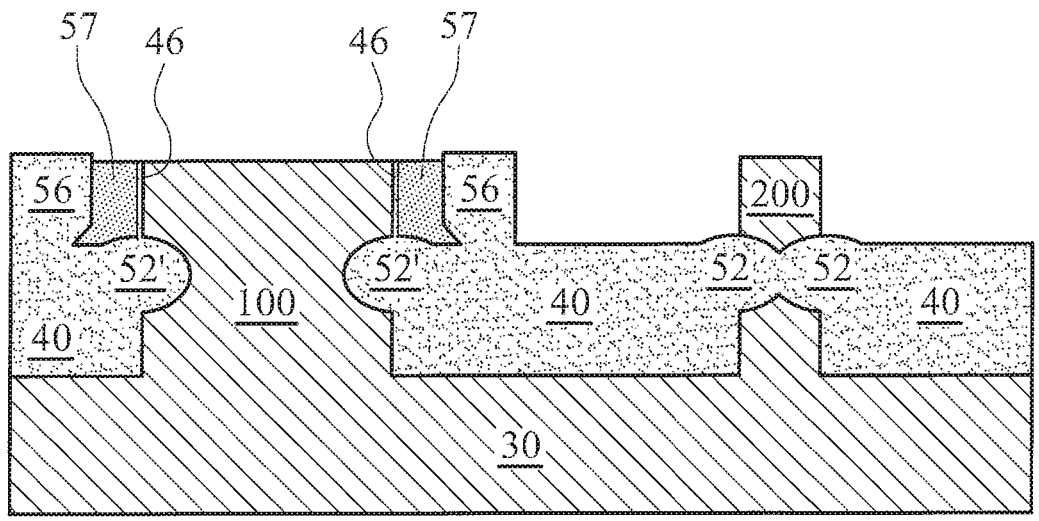
Figure 34:
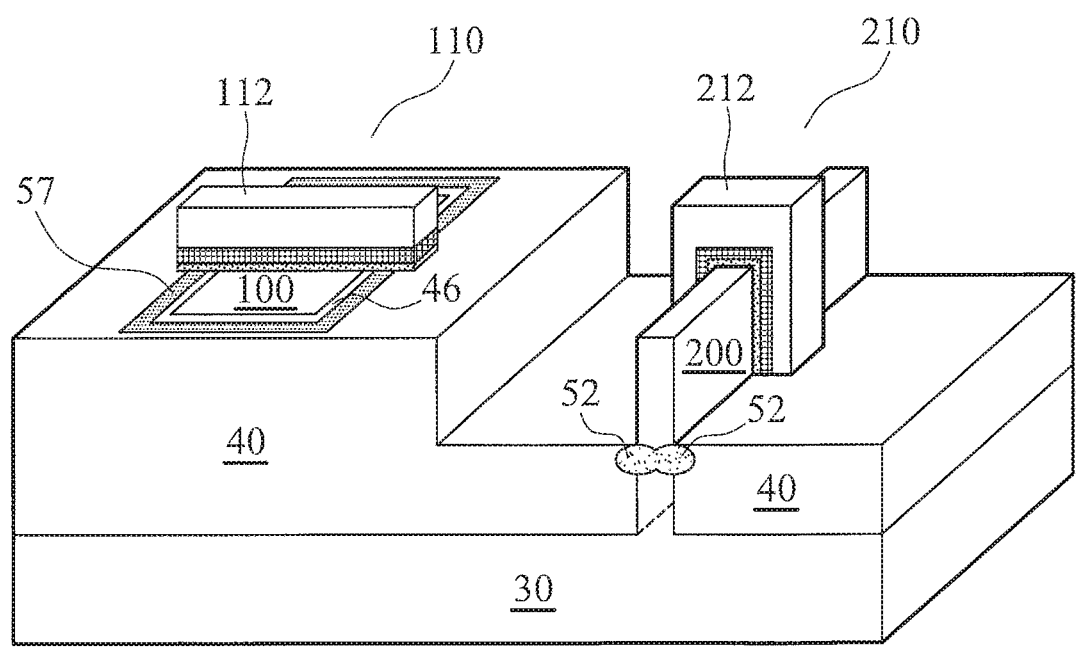
FIG. 34 illustrates a perspective view of the planar transistor and the FinFET manufactured using the steps shown in FIGS. 23 through 33.

Referring to FIG. 29, oxide 56 is formed to fill the gaps, and is then planarized until a top surface of hard mask layer 34 is exposed, as is shown in FIG. 30. In FIG. 31, oxide 56 is recessed using essentially the same method as shown in FIG. 19. Hard masks 34 and 48 are then removed, as is shown in FIG. 32. Next, pad layer 32 is removed, resulting the structure as shown in FIG. 33. Gate stacks and source/drain regions may then be formed, and a perspective view of the resulting structure is shown in FIG. 34. It is noted that this embodiment results in remain portions 57 (referred to as stressor 57, also refer to FIG. 33) of hard mask 48 to be left in oxide 56. Stressor 57 forms a ring surrounding active region 100, as is shown in FIG. 34. Stressor 57 is spaced apart from active region 100 by buffer oxide 46.

Figure 35:
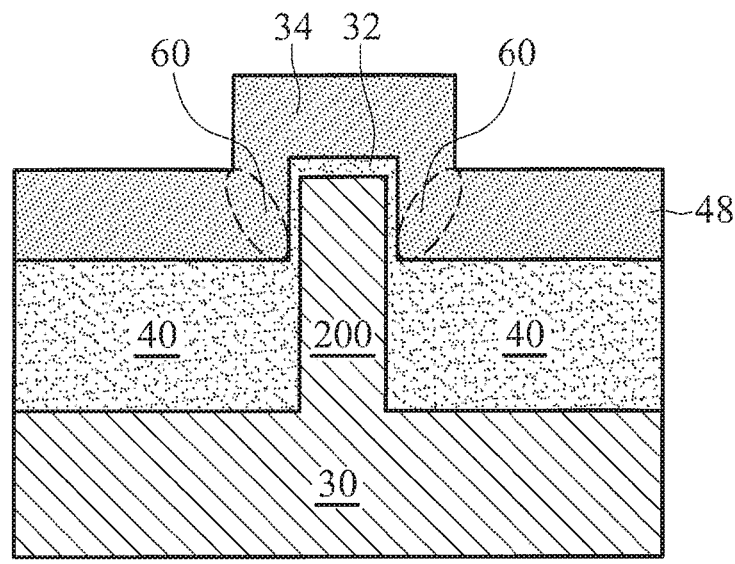
FIGS. 35 through 38 are cross-sectional views of intermediate stages in the manufacturing of punch-through stoppers.
Figure 36:
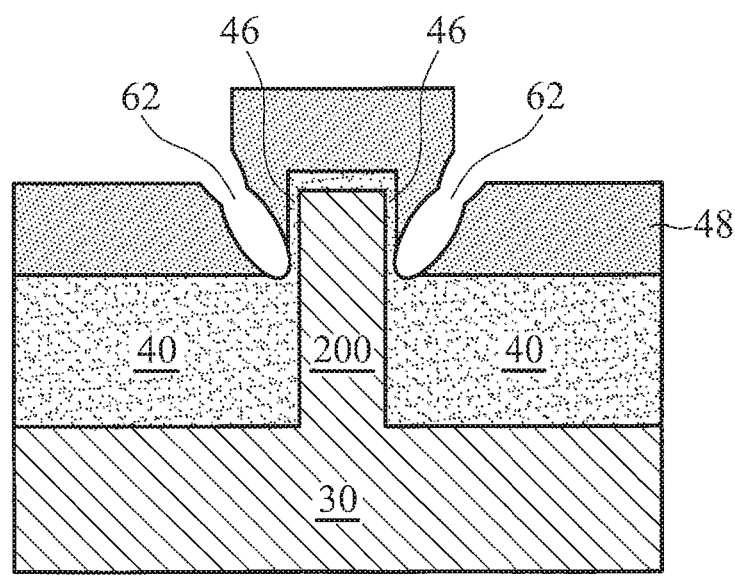
Figure 37:
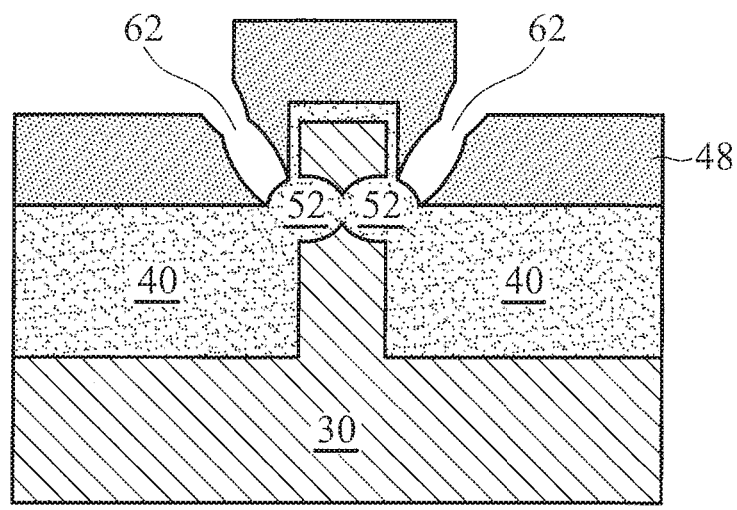
Figure 38:
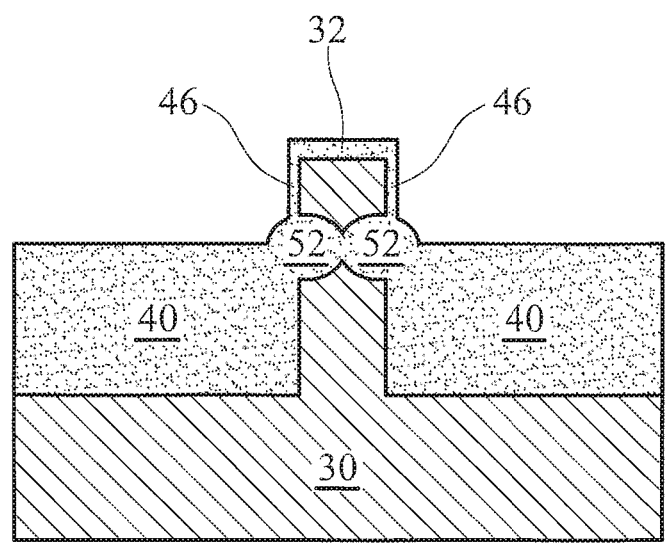

FIGS. 35 through 38 illustrate another embodiment for forming punch-through stoppers 52. The initial steps of this embodiment are essentially the same as shown in FIGS. 7 through 13. FIG. 35 illustrates the right side portion of the structure shown in FIG. 13. Typically, due to the process reasons, regions 60, at which the vertical and horizontal portions of hard mask 48 join, are more porous than the vertical portions and horizontal portions. Accordingly, an isotropic etch may be performed to etch hard mask 48. Referring to FIG. 36, before the vertical portions and horizontal portions of hard mask 48 are fully etched, openings 62 are formed, exposing buffer oxide 46. An oxidation, for example, a dry oxidation, is then performed, forming the structure as shown in FIG. 37, in which punch-through stoppers 52 are formed close to openings 62. Next, as shown in FIG. 38, hard mask 48 is removed. The remaining process steps may be essentially the same as shown in FIG. 21.

Figure 39:
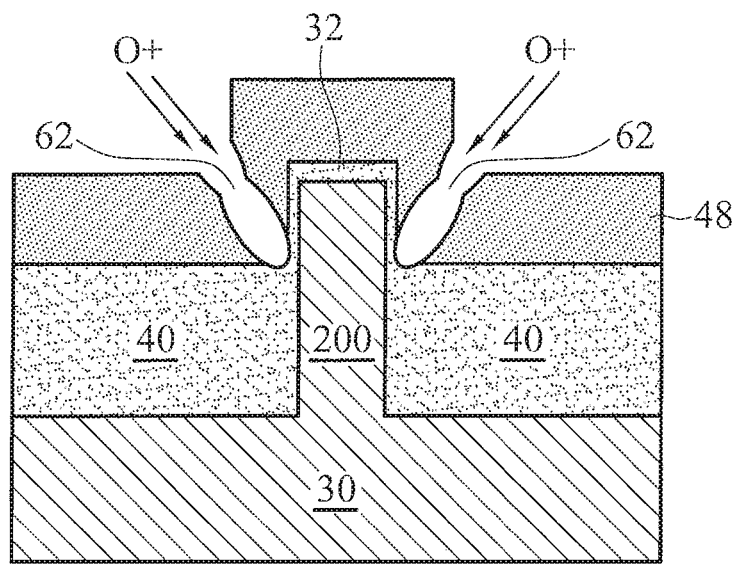
FIGS. 39 through 41 are cross-sectional views of intermediate stages of an alternative embodiment for forming punch-through stoppers.
Figure 40:
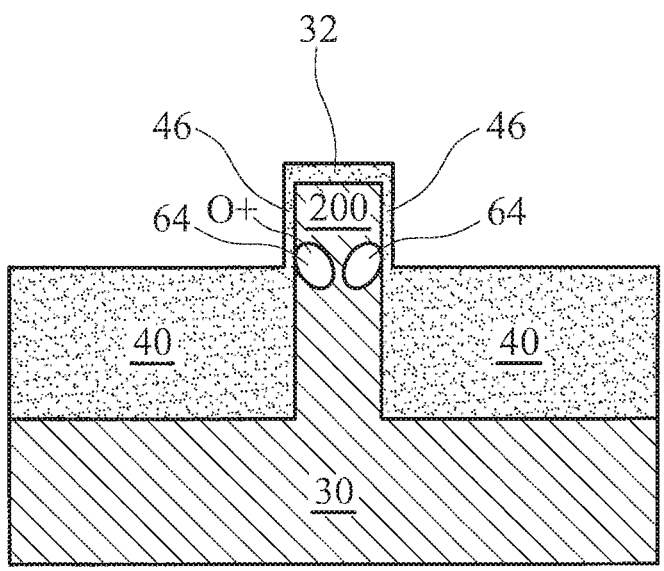
Figure 41:
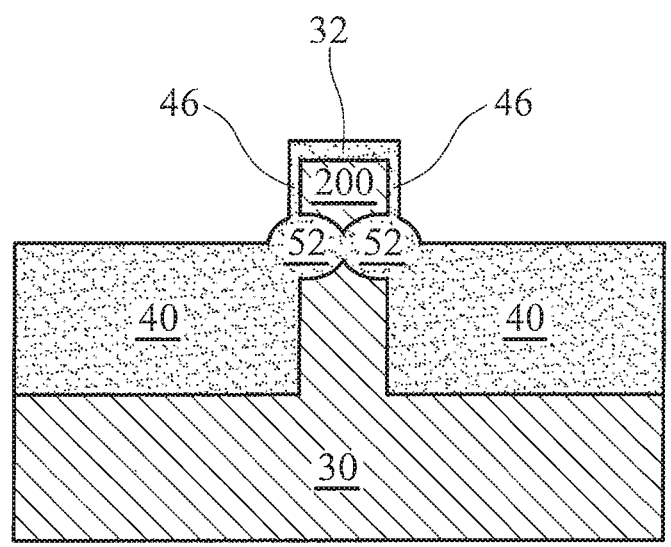

FIGS. 39 through 41 illustrate yet another embodiment for forming punch-through stoppers 52. The initial steps of this embodiment are essentially the same as shown in FIGS. 7 through 13, and FIGS. 35 and 36. Next, as shown in FIG. 39, oxygen ions are implanted into openings 62. The implantation is preferably tilted, so that the oxygen ions may penetrate through openings 62 and buffer oxide 46, and be implanted into active region 200. FIG. 40 schematically illustrates regions 64, in which the oxygen ions are concentrated. FIG. 40 also illustrates the removal of hard mask 48. Next, as shown in FIG. 41, a dry oxidation (or an annealing) is performed, for example, in an environment with no oxygen present, or an environment with oxygen. During the dry oxidation or the annealing, the oxygen ions in regions 64 react with silicon in active region 200, forming punch-through stoppers 52.

Figure 42:
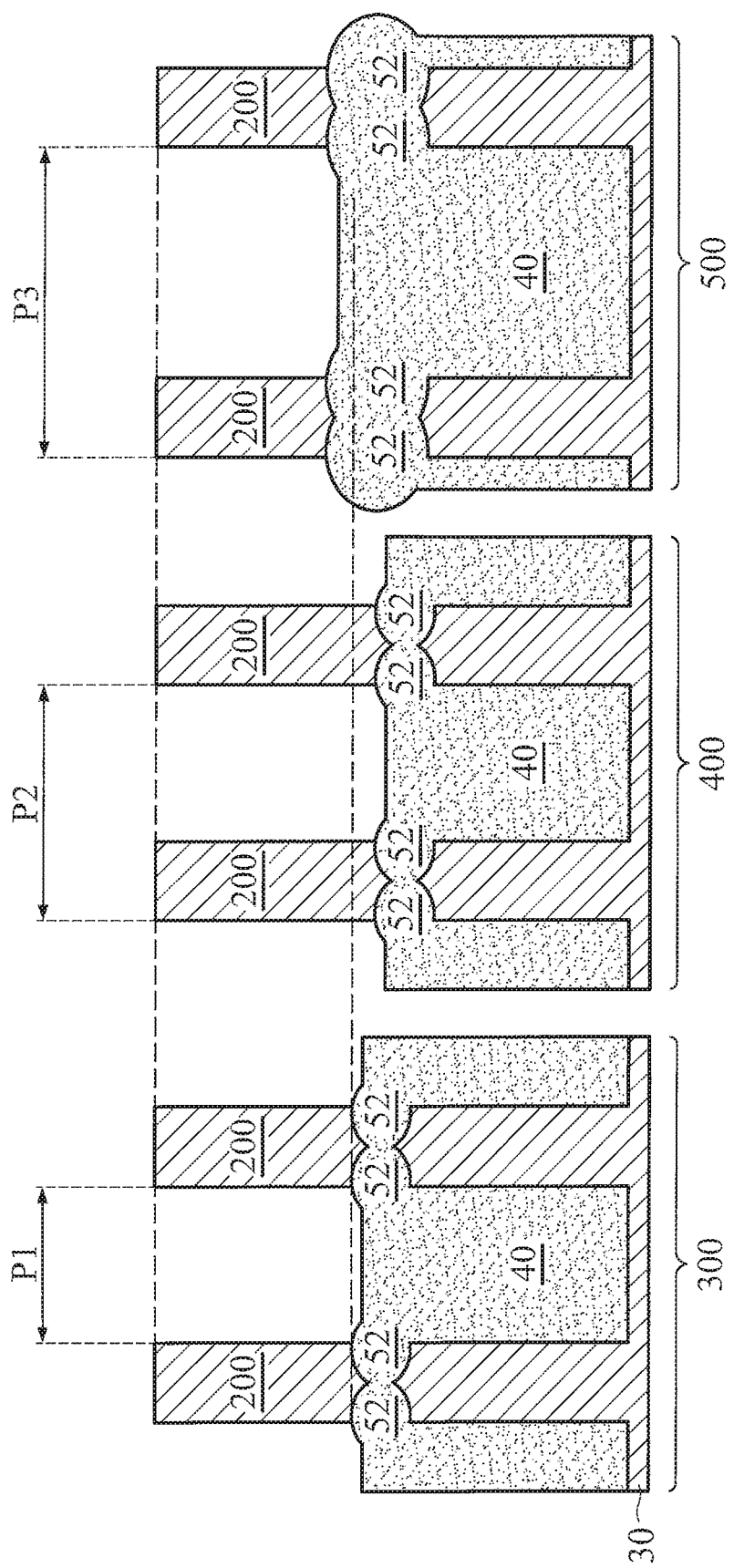
FIG. 42 illustrates different positions of the punch-through stoppers caused by the variation in pattern density.

It is realized that the embodiments discussed in the preceding paragraphs are related to the processing of STI regions 40. As is known in the art, the densities of STI regions 40 affect the efficiency of the recessing steps, for example, the step discussed in FIG. 11. Also, various cleaning steps may be involved, which also affect the rate of the loss of STI regions 40, and hence the height of fin 200. Accordingly, in pattern-dense regions and pattern-sparse regions, the top surface of STI regions 40 will not be leveled with each other. FIG. 42 illustrates three regions 300, 400, and 500, wherein region 400 has a higher pattern density and hence a smaller pitch P2 than the respective pattern density and pitch P1 in region 300. Region 500, on the other hand, has a lower pattern density and a greater pitch P3 than the respective pattern density and pitch P1 in region 300. The different densities cause the top surfaces of STI regions to be at different levels, and in turn causing the variation in the positions of punch-through stoppers 52. In FIG. 42, the top surfaces of STI regions 40 and the position of punch-through stoppers 52 in region 400 are lower than that in region 300, while the top surfaces of STI regions 40 and the position of punch-through stoppers 52 in region 500 are higher than that in region 300. Since the positions of punch-through stoppers 52 affect the heights of fin 200, such difference in the heights of fin 200 needs to be taken into design considerations.

The embodiments of the present have several advantageous features. The FinFETs formed using the embodiments of the present invention have reduced, and possibly substantially eliminated, punch-through currents due to the formation of punch-through stoppers, which fully isolate source and drain regions from the possible punch-through current paths. The reduction in the punch-through currents does not require highly priced SOI substrates. In addition, the channel regions do not require high impurity (well) concentrations, and the fin heights do not vary with the variation in the position of the top surface of STI regions. These results in smaller variation in the FinFET performance. The formation of the FinFETs is fully compatible with the formation of planar transistors.

In some aspects, embodiments described herein may provide for a semiconductor device including a semiconductor substrate having a topmost surface in which is formed a planar transistor, and FinFET transistor formed in the substrate. The FinFET transistor includes a semiconductor fin that has a topmost surface that is substantially planar with the topmost surface of the substrate, and a first isolation structure extending between the fin and the substrate.

In other aspects, embodiments described herein may provide for a semiconductor device including a semiconductor substrate having a topmost surface in which is formed a planar transistor. The device also includes a first multiple gate transistor fin having a topmost surface substantially level with the topmost surface of the semiconductor substrate. The first multiple gate fin includes a first isolation structure layer extending from a first sidewall of the first multiple gate transistor fin to a second sidewall of the first multiple gate transistor fin, the first isolation structure being a first distance below the topmost surface of the first multiple gate transistor fin. The device further includes a second multiple gate transistor fin having a topmost multiple gate transistor substantially level with the topmost surface of the semiconductor substrate, the second multiple gate transistor fin including a second isolation structure layer extending from a first sidewall of the second multiple gate transistor fin to a second sidewall of the second multiple gate transistor fin, the second isolation structure being a second distance below the topmost surface of the second multiple gate transistor fin, the second distance being greater than the first distance.

In yet other aspects, embodiments described herein may provide for a semiconductor device comprising a semiconductor substrate and a planar transistor having a source/drain region formed in a topmost surface of the substrate. The device also includes a fin having a topmost surface substantially level with the topmost surface of the substrate and extending below the topmost surface of the substrate. The fin includes an upper portion and a lower portion and a first isolation structure interjacent the upper portion and the lower portion.

In other aspects, embodiments described herein may provide for a device including a planar transistor in a first region of a semiconductor substrate and a finFET in a second region of the semiconductor substrate. The planar transistor comprising a first gate structure disposed at a topmost surface of the semiconductor substrate. The finFET comprising: a first fin disposed between a first isolation region and a second isolation region; a first isolation structure extending from the first isolation region to the second isolation region, the first isolation structure extending between a first upper region of the first fin and a first lower region of the first fin; and a second gate structure disposed over and along sidewalls of the first fin.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a planar transistor in a first region of a semiconductor substrate, the planar transistor comprising a first gate structure disposed at a topmost surface of the semiconductor substrate; and
   a finFET in a second region of the semiconductor substrate, the finFET comprising:
     a first fin disposed between a first isolation region and a second isolation region;
     a first isolation structure extending from the first isolation region to the second isolation region, the first isolation structure extending between and separating a first upper region of the first fin from a first lower region of the first fin; and
     a second gate structure disposed over and along sidewalls of the first fin.

2. The device of claim 1, wherein a topmost surface of the first fin is substantially level with the topmost surface of the semiconductor substrate.

3. The device of claim 1 further comprising a second isolation structure extending from the first isolation region to directly under the first gate structure.

4. The device of claim 3, wherein the first gate structure is disposed on a mesa of the semiconductor substrate, and wherein the second isolation structure extends into the mesa.

5. The device of claim 4 further comprising a hard mask along a sidewall of the mesa.

6. The device of claim 5 further comprising a buffer oxide between the hard mask and the sidewall of the mesa.

7. The device of claim 1, wherein the first isolation structure comprises an oxide of a semiconductor material of the first fin.

8. The device of claim 1 further comprising:
   a second fin including a second upper portion and a second lower portion; and
   a third isolation structure disposed between the second upper portion and the second lower portion, the third isolation structure being at a first distance below the topmost surface of the semiconductor substrate greater than a second distance below the topmost surface of the semiconductor substrate at which the first isolation structure is disposed.

9. A device comprising:
   a planar transistor in a first region of a semiconductor substrate, the planar transistor comprising a first gate structure disposed at a topmost surface of the semiconductor substrate; and
   a finFET in a second region of the semiconductor substrate, the finFET comprising:
     a first fin disposed between a first isolation region and a second isolation region, wherein the first fin comprises:
       a first upper region above the first isolation region; and
       a first lower region below the first upper region;
     a first isolation structure extending from the first isolation region to the second isolation region, the first isolation structure extending between and separating the first upper region of the first fin from the first lower region of the first fin; and a second gate structure disposed over and along sidewalls of the first upper region of the first fin.

10. The device of claim 9, wherein a topmost surface of the first fin is substantially level with the topmost surface of the semiconductor substrate.

11. The device of claim 9 further comprising a second isolation structure extending from the first isolation region to directly under the first gate structure.

12. The device of claim 11, wherein the first gate structure is disposed on a mesa of the semiconductor substrate, and wherein the second isolation structure extends into the mesa.

13. The device of claim 12 further comprising a hard mask along a sidewall of the mesa.

14. The device of claim 13 further comprising a buffer oxide between the hard mask and the sidewall of the mesa.

15. A device comprising:
a planar transistor in a first region of a semiconductor substrate, the planar transistor comprising a first gate structure disposed at a topmost surface of the semiconductor substrate; and
a finFET in a second region of the semiconductor substrate, the finFET comprising:
a first fin disposed between a first isolation region and a second isolation region, wherein a topmost surface of the first fin is level with the topmost surface of the semiconductor substrate;
a first isolation structure extending from the first isolation region to the second isolation region, the first isolation structure extending between and separating a first upper region of the first fin from a first lower region of the first fin; and
a second gate structure disposed over and along sidewalls of the first fin.

16. The device of claim 15, wherein the planar transistor is disposed on a semiconductor mesa region of the semiconductor substrate.

17. The device of claim 16, wherein a third isolation region extends into the semiconductor mesa.

18. The device of claim 15, wherein the first isolation structure comprises an oxide of a semiconductor material of the first fin.

19. The device of claim 15 further comprising a second fin disposed between the second isolation region and a fourth isolation region, wherein the second fin comprises:
an upper region above the second isolation region; and
a lower region below the upper region, wherein a second isolation structure separates the upper region of the second fin from the lower region of the second fin, and wherein the second isolation structure extends from the second isolation region to the fourth isolation region.

20. The device of claim 19, wherein the first isolation structure is a first distance below a topmost surface of the first fin, wherein the second isolation structure is a second distance below a topmost surface of the second fin, and wherein the first distance is different from the second distance.

* * * * *